(12) United States Patent
Huang

(10) Patent No.: US 11,521,924 B2
(45) Date of Patent: Dec. 6, 2022

(54) SEMICONDUCTOR DEVICE WITH FUSE AND ANTI-FUSE STRUCTURES AND METHOD FOR FORMING THE SAME

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 115 days.

(21) Appl. No.: 16/950,518

(22) Filed: Nov. 17, 2020

(65) Prior Publication Data
US 2022/0157717 A1    May 19, 2022

(51) Int. Cl.
| | | |
|---|---|---|
| H01L 23/525 | (2006.01) | |
| H01L 23/532 | (2006.01) | |
| H01L 21/768 | (2006.01) | |

(52) U.S. Cl.
CPC ...... *H01L 23/5256* (2013.01); *H01L 23/5329* (2013.01); *H01L 21/76892* (2013.01); *H01L 2924/09701* (2013.01)

(58) Field of Classification Search
CPC ............ H01L 23/5256; H01L 23/5329; H01L 2924/09701; H01L 21/76892
See application file for complete search history.

(56) References Cited

U.S. PATENT DOCUMENTS

2008/0206978 A1*  8/2008  Hsu ............... H01L 23/5256
                                                257/E23.149
2016/0079166 A1*  3/2016  Farooq ............ H01L 23/481
                                                257/529

* cited by examiner

*Primary Examiner* — Patricia D Valenzuela
(74) *Attorney, Agent, or Firm* — Muncy, Geissler, Olds & Lowe, P.C.

(57) ABSTRACT

The present disclosure provides a semiconductor device with a fuse structure and an anti-fuse structure and a method for forming the semiconductor device. The semiconductor device includes a first dielectric layer disposed over a semiconductor substrate, and a first electrode disposed over the first dielectric layer. The semiconductor device also includes a fuse link disposed over the first electrode, and a second electrode disposed over the fuse link. The semiconductor device further includes a third electrode disposed adjacent to the first electrode, and a second dielectric layer separating the first electrode from the first dielectric layer and the third electrode. The first electrode, the fuse link, and the second electrode form a fuse structure, and the first electrode, the third electrode, and a portion of the second dielectric layer between the first electrode and the third electrode form an anti-fuse structure.

14 Claims, 20 Drawing Sheets

SEMICONDUCTOR DEVICE WITH FUSE AND ANTI-FUSE STRUCTURES AND METHOD FOR FORMING THE SAME

TECHNICAL FIELD

The present disclosure relates to a semiconductor device and a method for forming the same, and more particularly, to a semiconductor device with a fuse structure and an anti-fuse structure and a method for forming the same.

DISCUSSION OF THE BACKGROUND

Integrated circuit (IC) devices are usually made with all internal connections set during the manufacturing process. However, due to high development costs, long manufacturing times, and high manufacturing tooling costs for forming such IC devices, users often desire circuits which can be configured or programmed in the field. Such circuits are called programmable circuits and they usually contain programmable links. Programmable links are electrical interconnects which are either broken or created at selected electronic nodes by the user after the IC device has been fabricated and packaged in order to activate or deactivate respective selected electronic nodes.

One type of the programmable links is a fuse structure. The programmable links in the IC devices are programmed by blowing the fuse structure at selected cross-over points to create an open circuit. The combination of blown and unblown links represents a digital bit pattern of ones and zeros signifying data which the user wishes to store in the IC device. Another type of the programmable links is an anti-fuse structure. Instead of the programming mechanism causing an open circuit in the case with fuse structures, the programming mechanism in the anti-fuse structure creates a short circuit or a relatively low resistance link therein.

In integration circuit fabrication, the fuse structure and the anti-fuse structure are widely used for fault tolerance. For example, the fuse structure and the anti-fuse structure may be placed in circuit paths in a semiconductor device. However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the structure and the manufacturing process of semiconductor devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first dielectric layer disposed over a semiconductor substrate, and a first electrode disposed over the first dielectric layer. The semiconductor device also includes a fuse link disposed over the first electrode, and a second electrode disposed over the fuse link. The semiconductor device further includes a third electrode disposed adjacent to the first electrode, and a second dielectric layer separating the first electrode from the first dielectric layer and the third electrode. The first electrode, the fuse link, and the second electrode form a fuse structure, and the first electrode, the third electrode, and a portion of the second dielectric layer between the first electrode and the third electrode form an anti-fuse structure.

In an embodiment, the third electrode is in direct contact with the first dielectric layer. In an embodiment, the third electrode is covered by the second dielectric layer. In an embodiment, the first electrode has a rounded profile in a cross-sectional view. In an embodiment, the first electrode and the fuse link are surrounded by the second dielectric layer. In an embodiment, a lower portion of the second electrode is surrounded by the second dielectric layer. In an embodiment, the first electrode has a first width, the fuse link has a second width, and the second electrode has a third width, wherein the third width is greater than the first width, and the first width is greater than the second width.

In another embodiment of the present disclosure, a semiconductor device is provided. The semiconductor device includes a first dielectric layer disposed over a semiconductor substrate, and a first conductive line and a second conductive line disposed over the first dielectric layer and extending parallel to each other. The semiconductor device also includes a second dielectric layer disposed between the first conductive line and the second conductive line. The first conductive line and the second conductive line are covered by the second dielectric layer. The semiconductor device further includes a third dielectric layer disposed over the second dielectric layer. The third dielectric layer has a different etch selectivity than the second dielectric layer. In addition, the semiconductor device includes a first electrode disposed between the first conductive line and the second conductive line. The first electrode has a rounded profile, and the first electrode is separated from the first dielectric layer by the second dielectric layer. The semiconductor device also includes a second electrode disposed over the first electrode. The second electrode extends from the second dielectric layer to the third dielectric layer.

In an embodiment, the first electrode, the first conductive line, and a portion of the second dielectric layer sandwiched between the first electrode and the first conductive line form an anti-fuse structure. In an embodiment, the semiconductor device further includes a fuse link disposed between the first electrode and the second electrode, wherein the first electrode, the second electrode, and the fuse link form a fuse structure. In an embodiment, the first electrode is in direct contact with the first conductive line, and the first electrode and the first conductive line form a fuse structure. In an embodiment, the semiconductor device further includes a dielectric portion disposed between the first electrode and the second electrode, wherein the first electrode, the second electrode, and the dielectric portion form an anti-fuse structure. In an embodiment, the dielectric portion has a first width, the second electrode has a second width, and the second width is greater than the first width. In an embodiment, the semiconductor device further includes a third conductive line disposed over the first dielectric layer and extending parallel to the first conductive line, wherein the first conductive line is between the second conductive line and the third conductive line, and wherein the first conductive line and the third conductive line have an air gap therebetween, the air gap is sealed by the third dielectric layer. In an embodiment, a sidewall of the first conductive line and a sidewall of the third conductive line are exposed by the air gap.

In yet another embodiment of the present disclosure, a semiconductor device is provided. The semiconductor device includes a first dielectric layer disposed over a semiconductor substrate, and a second dielectric layer disposed over the first dielectric layer. The semiconductor device also includes a first electrode disposed in the second dielectric layer, and a dielectric portion disposed over the first electrode. The semiconductor device further includes a second electrode disposed over the dielectric portion, and a third electrode disposed adjacent to and in direct contact with the first electrode. The first electrode, the dielectric portion, and the second electrode form an anti-fuse structure, and the first electrode and the third electrode form a fuse structure.

In an embodiment, the first electrode is separated from the first dielectric layer by the second dielectric layer, and the third electrode is in direct contact with the first dielectric layer. In an embodiment, the dielectric portion is surrounded by the second dielectric layer, wherein the first electrode has a first width, the dielectric portion has a second width, and the first width is greater than the second width. In an embodiment, the third electrode is sandwiched between the first electrode and an air gap in the second dielectric layer, wherein the first electrode and the air gap have rounded profiles in a cross-sectional view. In an embodiment, the semiconductor device further includes a third dielectric layer disposed over the second dielectric layer and surrounding the second electrode, wherein a top surface of the second dielectric layer is higher than an interface between the third dielectric layer and the air gap.

Embodiments of a semiconductor device and method for forming the same are provided in the disclosure. In some embodiments, the semiconductor device includes a fuse link disposed over a first electrode, and a second electrode disposed over the fuse link. In some embodiments, the semiconductor device also includes a third electrode disposed adjacent to the first electrode, and a dielectric layer separating the first electrode and the third electrode. The first electrode, the fuse link, and the second electrode form a vertical fuse structure, and the first electrode, the third electrode and a portion of the dielectric layer between the first electrode and the third electrode form a lateral anti-fuse structure. Therefore, the vertical fuse structure and the lateral anti-fuse structure may be integrated. As a result, the integration of a semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
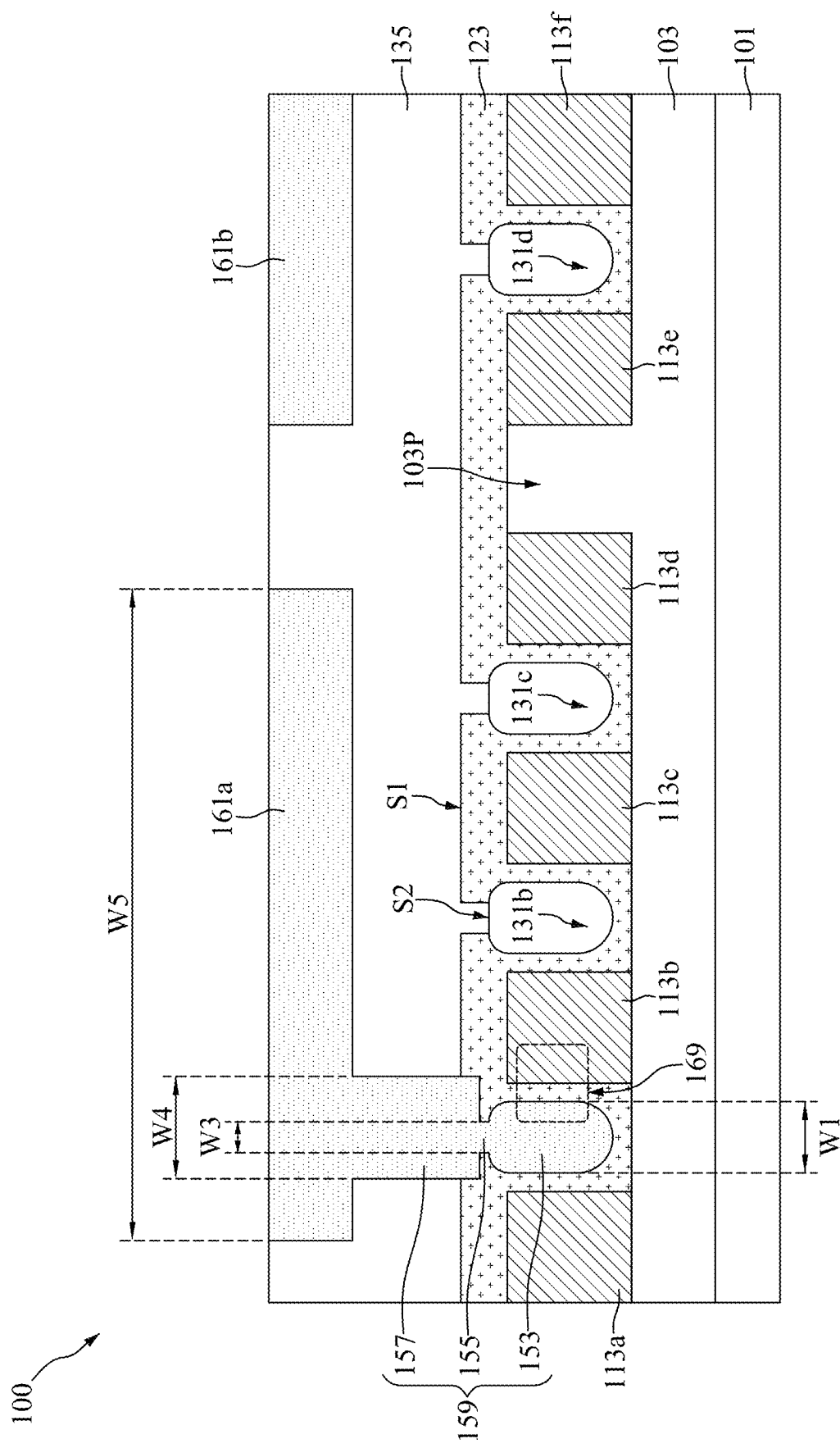
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes a semiconductor substrate 101, a dielectric layer 103 (also referred to herein as a first dielectric layer) disposed over the semiconductor substrate 101, and a plurality of conductive lines 113a, 113b, 113c, 113d, 113e and 113f disposed over the dielectric layer 103. In some embodiments, the conductive lines 113a, 113b, 113c, 113d, 113e and 113f are parallel to each other, and the dielectric layer 103 has a protruded portion 103P disposed between the conductive lines 113d and 113e.

Moreover, the semiconductor device 100 includes a dielectric layer 123 (also referred to herein as a second dielectric layer) disposed over the dielectric layer 103 and the conductive lines 113a, 113b, 113c, 113d, 113e and 113f, and a dielectric layer 135 (also referred to herein as a third dielectric layer) disposed over the dielectric layer 123. In some embodiments, the top surfaces and the sidewalls of the conductive lines 113a, 113b, 113c, 113d, 113e and 113f are covered by the dielectric layer 123. In other words, the dielectric layer 123 extends into the spaces between the conductive lines 113a, 113b, 113c, 113d, 113e and 113f.

In some embodiments, the semiconductor device 100 includes a plurality of air gaps 131b, 131c and 131d enclosed by the dielectric layers 123 and 135. As shown in FIG. 1, the air gap 131b is between the conductive lines 113b and 113c, the air gap 131c is between the conductive lines 113c and 113d, and the air gap 131d is between the conductive lines 113e and 113f. In some embodiments, the top surface S1 of the dielectric layer 123 is higher than the bottom surface S2 of the dielectric layer 135 (the bottom surface S2 of the dielectric layer 135 is also referred to herein as the interface between the dielectric layer 135 and the air gap 131b).

In addition, the semiconductor device 100 includes an electrode 153 disposed in the dielectric layer 123 and between the conductive lines 113a and 113b, a fuse link 155 disposed over the electrode 153, and an electrode 157 disposed over the fuse link 155. In some embodiments, the electrode 153, the fuse link 155, and the lower portion of the electrode 157 are surrounded by the dielectric layer 123, and the upper portion of the electrode 157 is surrounded by the dielectric layer 135. Furthermore, the semiconductor device 100 includes conductive lines 161a and 161b disposed in the upper portion of the dielectric layer 135. In some embodiments, the conductive line 161a is disposed over the electrode 157.

It should be noted that the electrode 153 (also referred to herein as a first electrode), the fuse link 155, and the electrode 157 (also referred to herein as a second electrode) form a fuse structure 159, and the electrode 153, the conductive lines adjacent to the electrode 153 (e.g., the conductive line 113b which is also referred to herein as a third electrode), and the portion of the dielectric layer 123 disposed therebetween form an anti-fuse structure (e.g., an anti-fuse structure 169), in accordance with some embodiments. By integrating the vertical fuse structure 159 and the lateral anti-fuse structure 169 into the semiconductor device 100, the integration of the semiconductor device 100 may be increased.

As shown in FIG. 1, the electrode 153 has a width W1, the fuse link 155 has a width W3, and the electrode 157 has a width W4. In some embodiments, the width W4 is greater than the width W1, and the width W1 is greater than the width W3. Moreover, the conductive line 161a has a width W5. In some embodiments, the width W5 is greater than the width W4 of the electrode 157.

Figure 2:
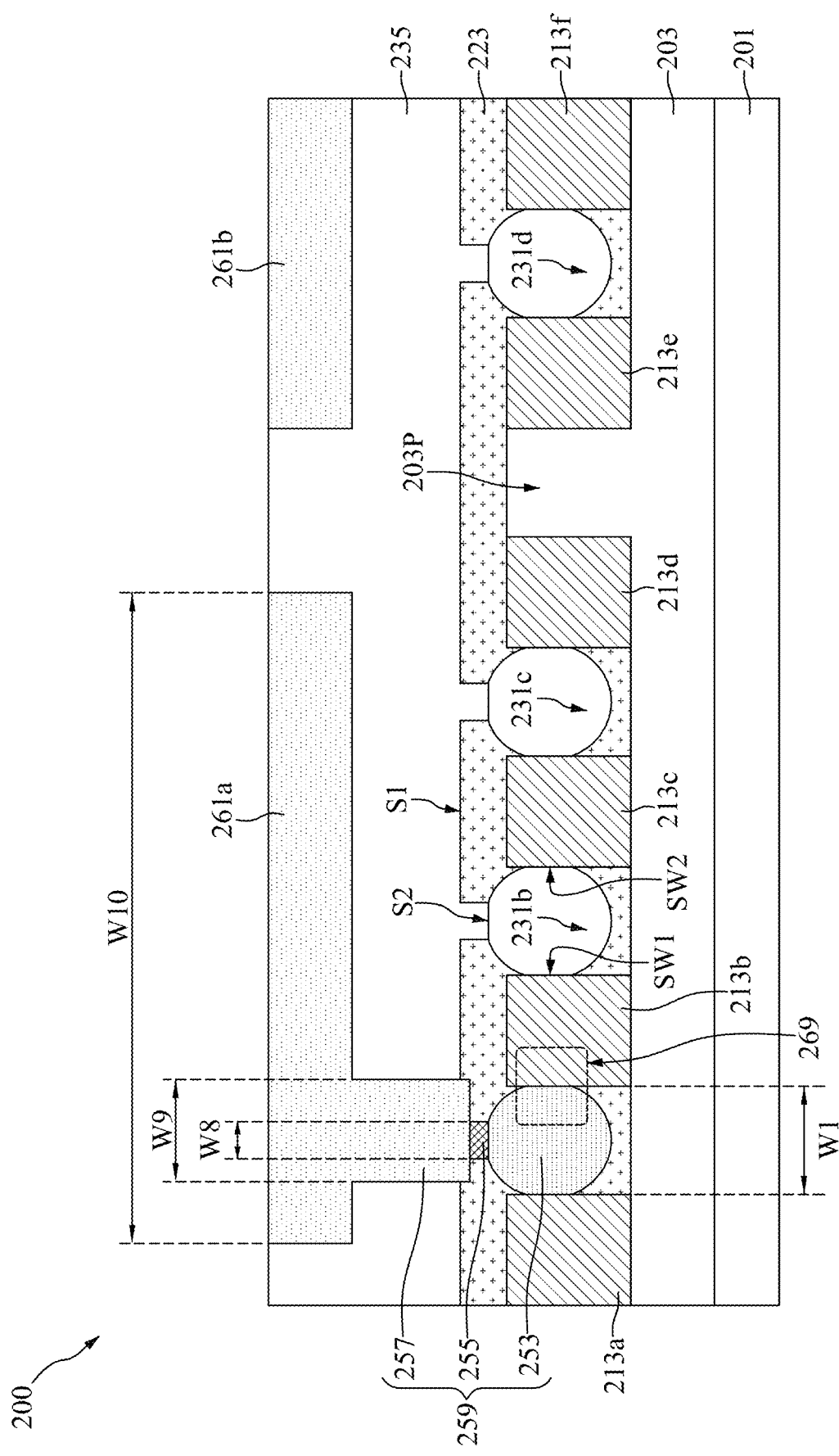
FIG. 2 is a cross-sectional view illustrating a modified semiconductor device, in accordance with some embodiments.

FIG. 2 is a cross-sectional view illustrating a modified semiconductor device 200, in accordance with some embodiments. Similar to the semiconductor device 100, the semiconductor device 200 includes a semiconductor substrate 201, a dielectric layer 203 (also referred to herein as a first dielectric layer) disposed over the semiconductor substrate 201, and a plurality of conductive lines 213a, 213b, 213c, 213d, 213e and 213f disposed over the dielectric layer 203. In some embodiments, the conductive lines 213a, 213b, 213c, 213d, 213e and 213f are parallel to each other, and the dielectric layer 203 has a protruded portion 203P disposed between the conductive lines 213d and 213e.

Moreover, the semiconductor device 200 includes a dielectric layer 223 (also referred to herein as a second dielectric layer) disposed over the dielectric layer 203 and the conductive lines 213a, 213b, 213c, 213d, 213e and 213f, and a dielectric layer 235 (also referred to herein as a third dielectric layer) disposed over the dielectric layer 223. In some embodiments, the semiconductor device 200 includes an air gap 231b disposed between the conductive lines 213b and 213c, an air gap 231c disposed between the conductive lines 213c and 213d, and an air gap 231d disposed between the conductive lines 213e and 213f. In some embodiments, the top surface S1 of the dielectric layer 223 is higher than the bottom surface S2 of the dielectric layer 235 (the bottom surface S2 of the dielectric layer 235 is also referred to herein as the interface between the dielectric layer 235 and the air gap 231b). In some embodiments, the programming mechanism in the anti-fuse structure creates a short circuit or a relatively low resistance link therein, and the fuse structure 269 in FIG. 2 can be considered the structure after programming the anti-fuse structure 169 in FIG. 1.

One of the differences between the semiconductor device 100 and the semiconductor device 200 is that the air gaps 231b, 231c and 231d of the semiconductor device 200 are enclosed by the dielectric layer 223, the dielectric layer 235, and the conductive lines 213b, 213c, 213d, 213e and 213f. More specifically, portions of the sidewalls of the conductive lines 213b, 213c, 213d, 213e and 213f are exposed by the air gaps 231b, 231c and 231d. For example, the sidewall SW1 of the conductive line 213b and the sidewall SW2 of the conductive line 213c are partially exposed by the air gap 231b.

In addition, the semiconductor device 200 includes an electrode 253 disposed in the dielectric layer 223 and between the conductive lines 213a and 213b, a dielectric portion 255 disposed over the electrode 253, and an electrode 257 disposed over the dielectric portion 255. In some embodiments, the electrode 253 is in direct contact with the conductive lines 213a and 213b. In some embodiments, the electrode 253, the dielectric portion 255, and the lower portion of the electrode 257 are surrounded by the dielectric layer 223, and the upper portion of the electrode 257 is surrounded by the dielectric layer 235. Furthermore, the semiconductor device 200 includes conductive lines 261a and 261b disposed in the upper portion of the dielectric layer 235. In some embodiments, the conductive line 261a is disposed over the electrode 257.

It should be noted that the electrode 253 (also referred to herein as a first electrode), the dielectric portion 255, and the electrode 257 (also referred to herein as a second electrode) form an anti-fuse structure 259, and the electrode 253 and the conductive lines adjacent to the electrode 253 (e.g., the conductive line 213b which is also referred to herein as a third electrode) form a fuse structure (e.g., a fuse structure 269), in accordance with some embodiments. By integrating the vertical anti-fuse structure 259 and the lateral fuse structure 269 into the semiconductor device 200, the integration of the semiconductor device 200 may be increased.

As shown in FIG. 2, the electrode 253 has a width W1, the dielectric portion 255 has a width W8, and the electrode 257 has a width W9. In some embodiments, the width W1 and the width W9 are greater than the width W8. Moreover, the conductive line 161a has a width W10. In some embodiments, the width W10 is greater than the width W9 of the electrode 257.

Figure 3:
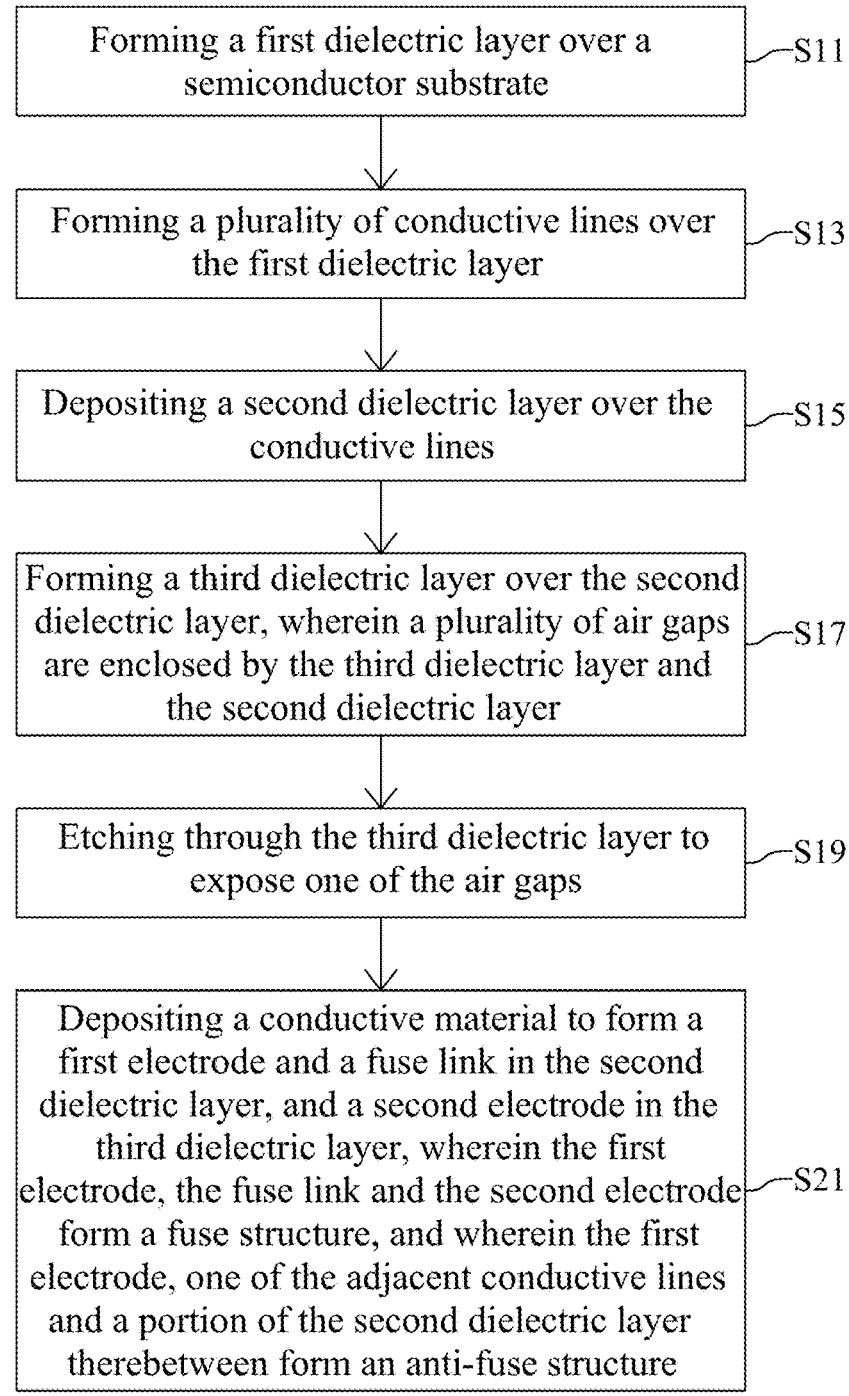
FIG. 3 is a flow diagram illustrating a method for forming a semiconductor device, in accordance with some embodiments.
Figure 4:
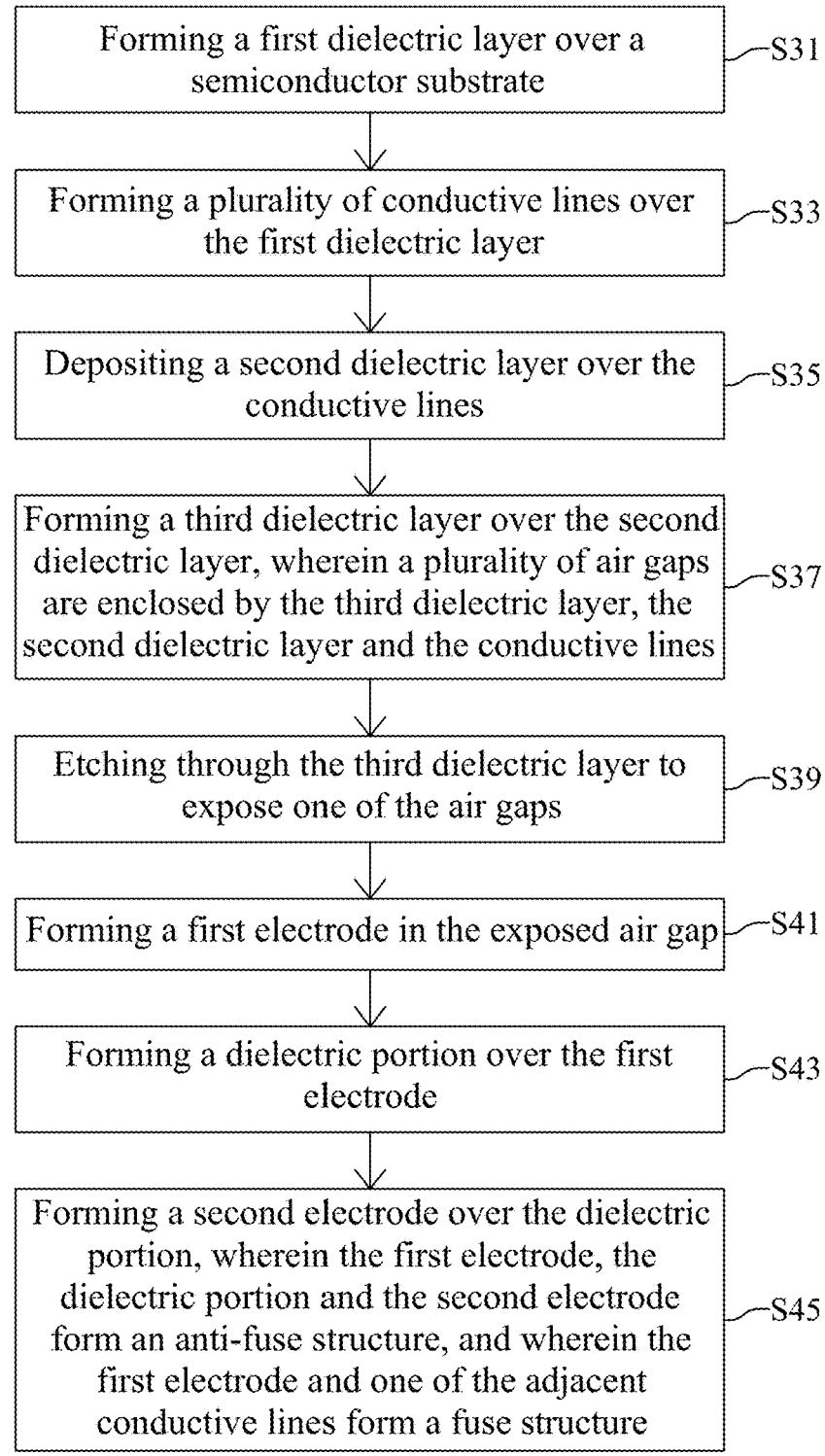
FIG. 4 is a flow diagram illustrating a method for forming a modified semiconductor device, in accordance with some embodiments.

FIG. 3 is a flow diagram illustrating a method 10 for forming the semiconductor device 100, and the method 10 includes steps S11, S13, S15, S17, S19 and S21, in accordance with some embodiments. FIG. 4 is a flow diagram illustrating a method 30 for forming the semiconductor device 200, and the method 30 includes steps S31, S33, S35, S37, S39, S41, S43 and S45, in accordance with some embodiments. The steps S11 to S21 of FIG. 3 and the steps S31 to S45 of FIG. 4 are elaborated in connection with the following figures.

Figure 5:
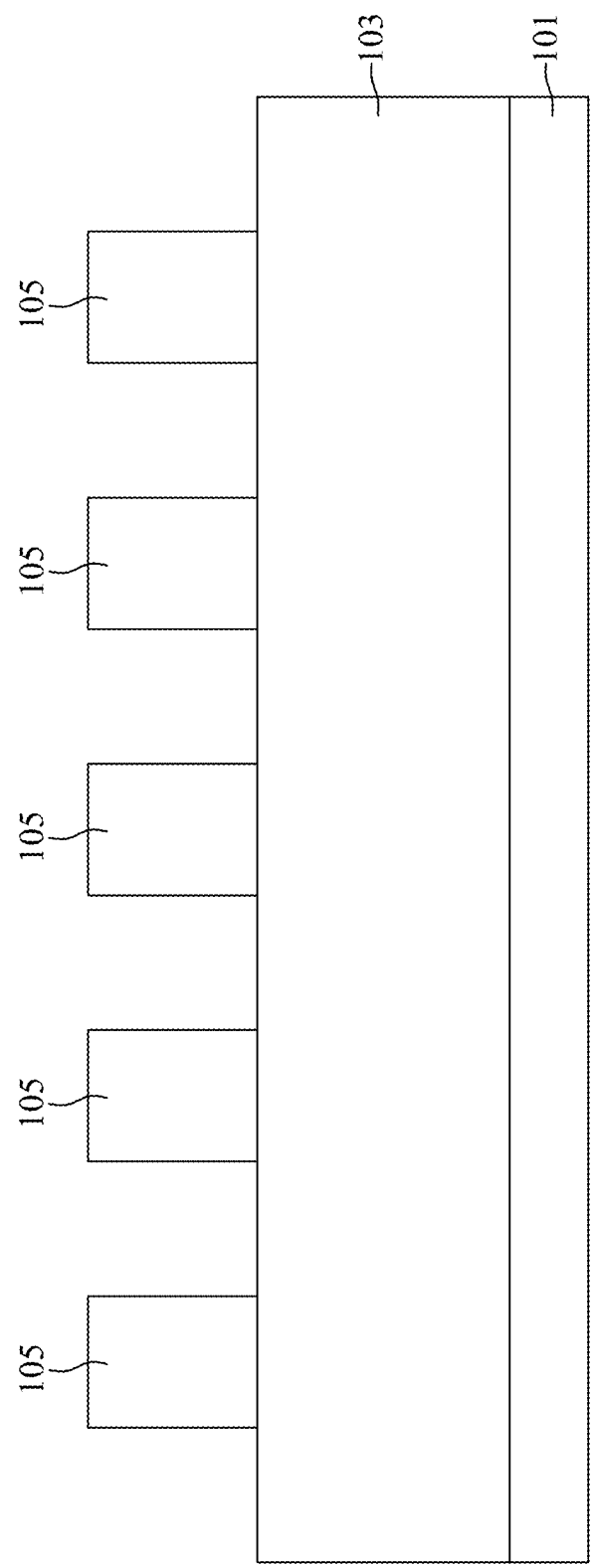
FIG. 5 is a cross-sectional view illustrating an intermediate stage of sequentially forming a first dielectric layer and a patterned mask over a semiconductor substrate during the formation of the semiconductor device, in accordance with some embodiments.

FIGS. 5 to 14 are cross-sectional views illustrating intermediate stages of forming the semiconductor device 100, in accordance with some embodiments. As shown in FIG. 5, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 5, the dielectric layer 103 is formed over the semiconductor substrate 101, in accordance with some embodiments. The respective step is illustrated as the step S11 in the method 10 shown in FIG. 3. In some embodiments, the dielectric layer 103 is made of low-k dielectric materials. In some embodiments, the low-k dielectric materials have a dielectric constant (k value) less than about 4. Examples of the low-k dielectric materials include, but not limited to, silicon oxide, silicon nitride, silicon oxynitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

Moreover, the dielectric layer 103 may be formed by a deposition process. The deposition process may include a chemical vapor deposition (CVD) process, a physical vapor deposition (PVD) process, an atomic layer deposition (ALD) process, a spin-coating process, or another applicable process. After the dielectric layer 103 is formed, a patterned mask 105 may be formed over the dielectric layer 103, as shown in FIG. 5 in accordance with some embodiments.

Figure 6:
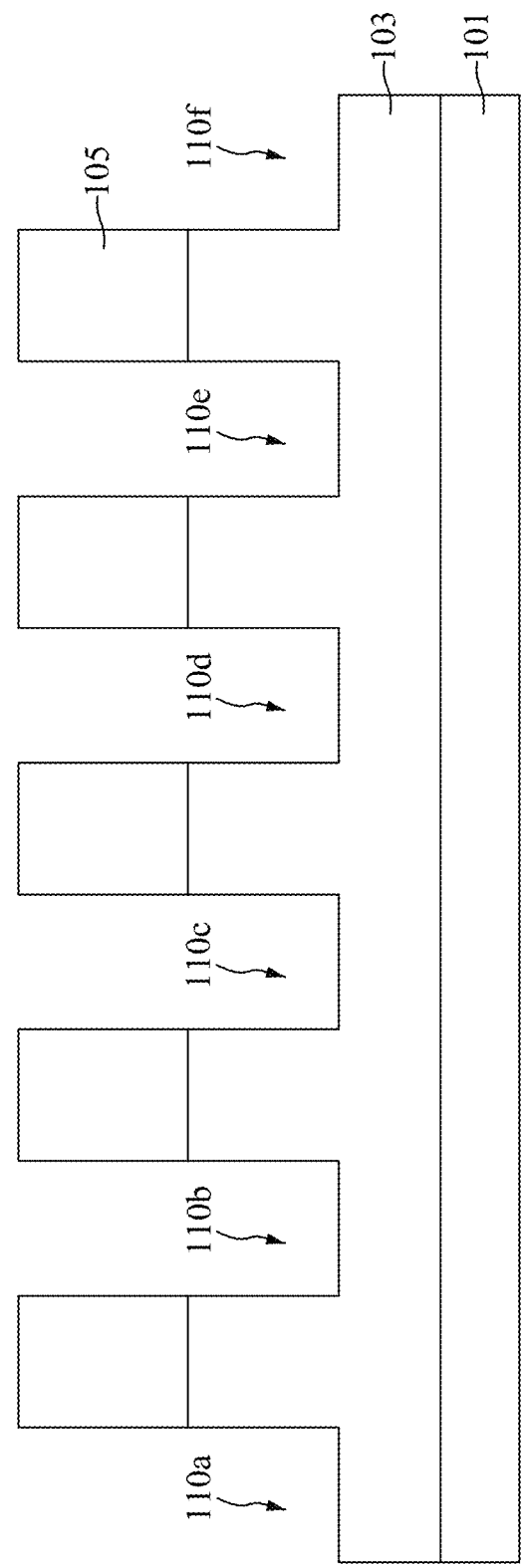
FIG. 6 is a cross-sectional view illustrating an intermediate stage of etching the dielectric layer by using the patterned mask as a mask during the formation of the semiconductor device, in accordance with some embodiments.

Next, the dielectric layer 103 is etched by using the patterned mask 105 as a mask, such that a plurality of openings 110a, 110b, 110c, 110d, 110e and 110f are formed in the dielectric layer 103, as shown in FIG. 6 in accordance with some embodiments. In some embodiments, the openings 110a, 110b, 110c, 110d, 110e and 110f are parallel to each other.

In some embodiments, each of the openings 110a, 110b, 110c, 110d, 110e and 110f have substantially the same width. In some embodiments, each adjacent pair of the openings 110a, 110b, 110c, 110d, 110e and 110f have substantially the same distance. Within the context of this disclosure, the word "substantially" means preferably at least 90%, more preferably 95%, even more preferably 98%, and most preferably 99%. In some embodiments, the dielectric layer 103 is etched by a wet etching process, a dry etching process, or a combination thereof. After the etching process, the patterned mask 105 may be removed.

Figure 7:
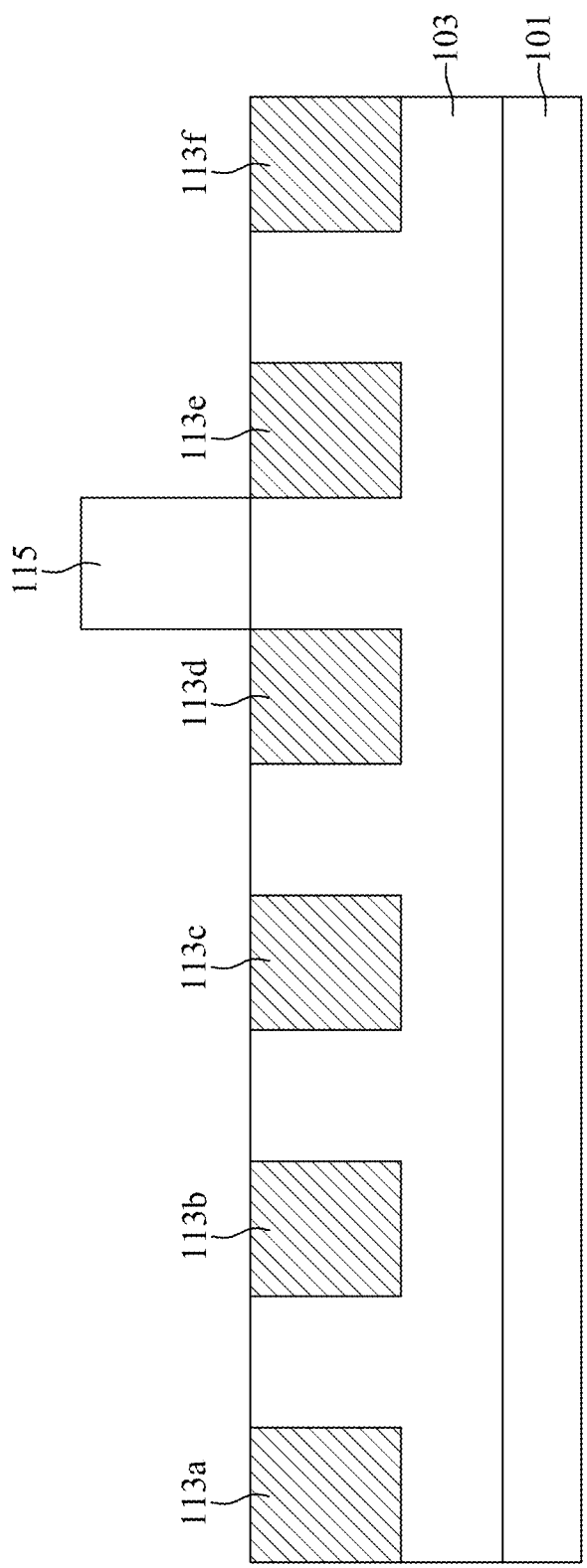
FIG. 7 is a cross-sectional view illustrating an intermediate stage of forming a plurality of conductive lines in the first dielectric layer during the formation of the semiconductor device, in accordance with some embodiments.

Then, the conductive lines 113a, 113b, 113c, 113d, 113e and 113f are formed in the openings 110a, 110b, 110c, 110d, 110e and 110f, as shown in FIG. 7 in accordance with some embodiments. The respective step is illustrated as the step S13 in the method 10 shown in FIG. 3. At this stage, the conductive lines 113a, 113b, 113c, 113d, 113e and 113f are surrounded by the dielectric layer 103.

In some embodiments, the conductive lines 113a, 113b, 113c, 113d, 113e and 113f include aluminum (Al), copper (Cu), tungsten (W), titanium (Ti), tantalum (Ta), or another applicable conductive material. The formation of the conductive lines 113a, 113b, 113c, 113d, 113e and 113f may include conformally depositing a conductive material (not shown) over the dielectric layer 103 and filling the openings 110a, 110b, 110c, 110d, 110e and 110f, and performing a planarization process to remove excess portion of the conductive material over the top surface of the dielectric layer 103. The deposition process for forming the conductive lines 113a, 113b, 113c, 113d, 113e and 113f may include a CVD process, a PVD process, an ALD process, a plating process, a sputtering process, or a combination thereof. The planarization process for forming the conductive lines 113a, 113b, 113c, 113d, 113e and 113f may include a chemical mechanical polishing (CMP) process.

After the conductive lines 113a, 113b, 113c, 113d, 113e and 113f are formed, a patterned mask 115 is formed over the dielectric layer 103, as shown in FIG. 7 in accordance with some embodiments. Specifically, the patterned mask 115 is configured to protect some regions in the dielectric layer 103, which will remain intact in the subsequent etching process.

Figure 8:
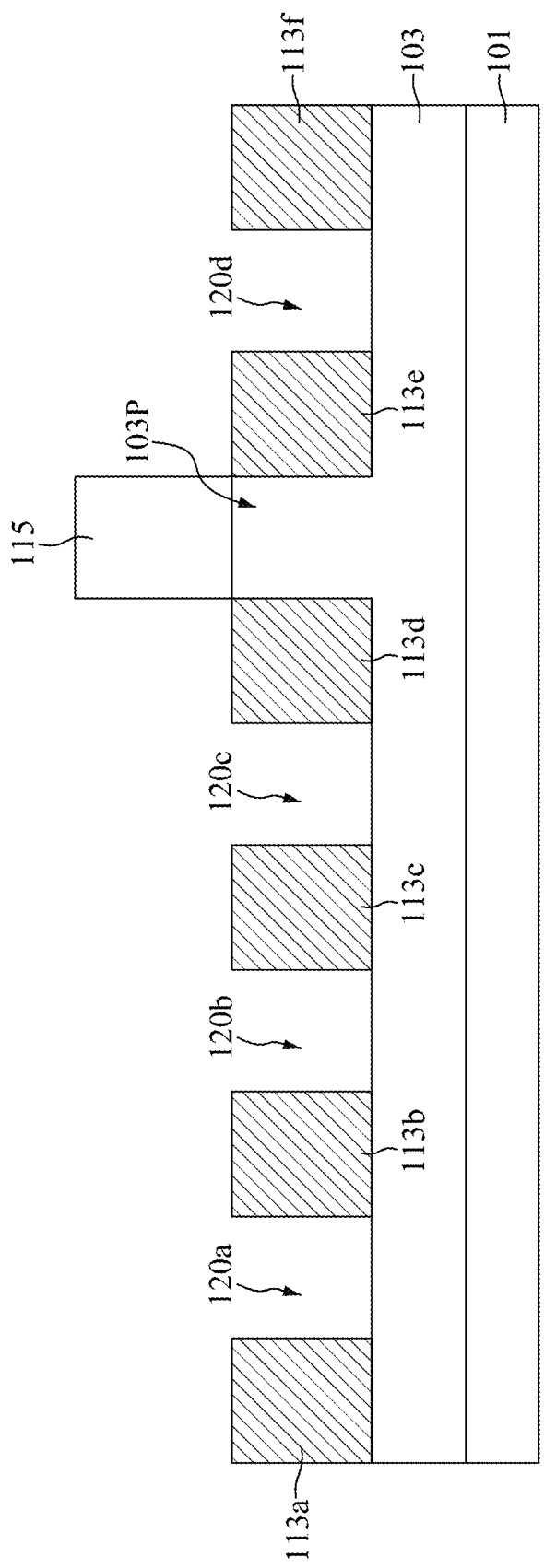
FIG. 8 is a cross-sectional view illustrating an intermediate stage of removing the portions of the first dielectric layer between the conductive lines during the formation of the semiconductor device, in accordance with some embodiments.

Next, the dielectric layer 103 is etched by using the patterned mask 115 and the conductive lines 113a, 113b, 113c, 113d, 113e, 113f as a mask, such that a plurality of openings 120a, 120b, 120c and 120d are formed between the conductive lines 113a, 113b, 113c, 113d, 113e and 113f, as shown in FIG. 8 in accordance with some embodiments. In some embodiments, the etching process may be performed until the exposed top surface of the dielectric layer 103 between the conductive lines 113a, 113b, 113c, 113d, 113e and 113f are substantially level with the bottom surfaces of the conductive lines 113a, 113b, 113c, 113d, 113e and 113f.

In some embodiments, the etching process for forming the openings 120a, 120b, 120c and 120d includes a wet etching process, a dry etching process, or a combination thereof. Moreover, after the etching process, the protruded portion 103P of the dielectric layer 103 covered by the patterned mask 115 remains intact, and the patterned mask 115 may be removed to expose the protruded portion 103P, in accordance with some embodiments.

Figure 9:
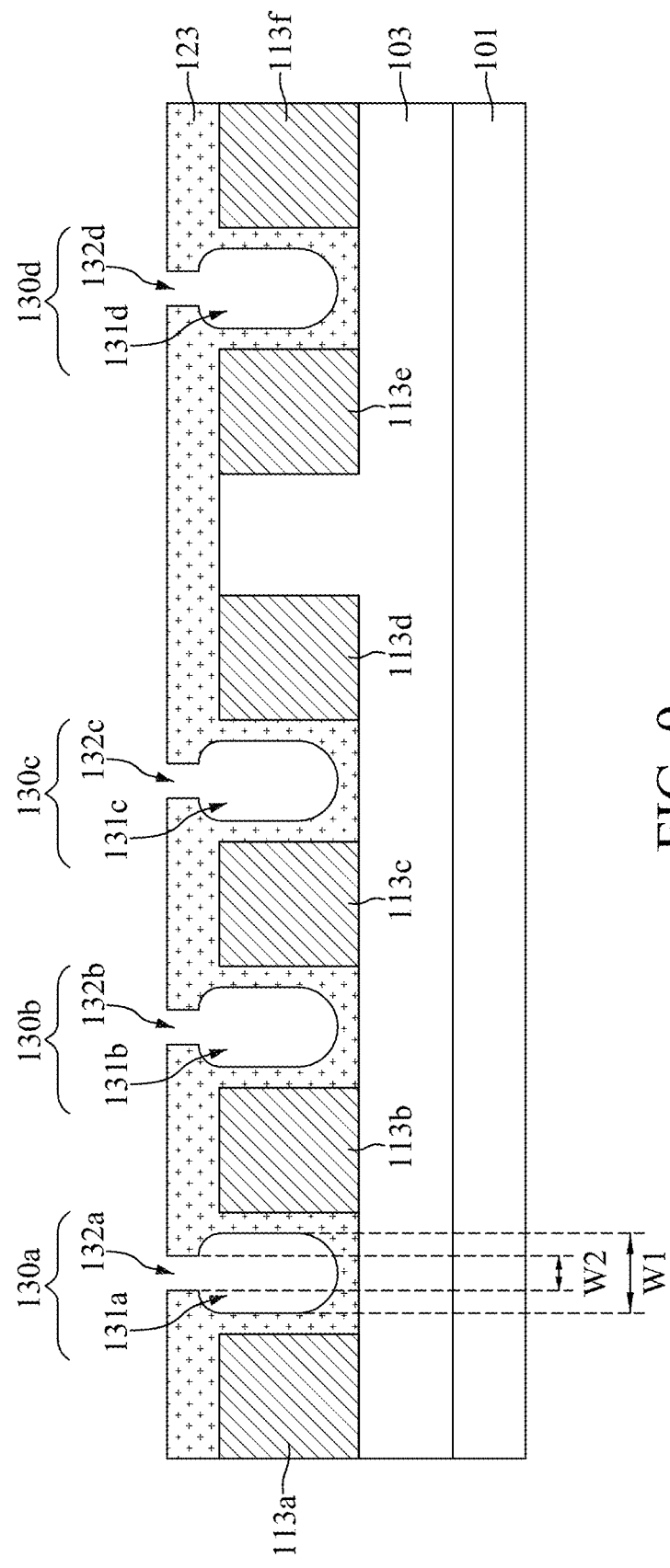
FIG. 9 is a cross-sectional view illustrating an intermediate stage of forming a second dielectric layer over the first dielectric layer and the conductive lines during the formation of the semiconductor device, in accordance with some embodiments.

After the openings 120a, 120b, 120c and 120d are formed, the dielectric layer 123 is conformally deposited over the conductive lines 113a, 113b, 113c, 113d, 113e and 113f, as shown in FIG. 9 in accordance with some embodiments. The respective step is illustrated as the step S15 in the method 10 shown in FIG. 3. In some embodiments, the top surface of the protruded portion 103P of the dielectric layer 103 is covered by the dielectric layer 123.

In some embodiments, the dielectric layer 123 extends into the openings 120a, 120b, 120c and 120d to line the sidewalls of the conductive lines 113a, 113b, 113c, 113d, 113e and 113f, such that openings 130a, 130b, 130c, 130d are formed between the conductive lines 113a, 113b, 113c, 113d, 113e and 113f. Moreover, the dielectric layer 123 has neck portions located at the top portions of the openings 130a, 130b, 130c, 130d. Specifically, each of the openings 130a, 130b, 130c, 130d includes a lower portion and an upper portion. For example, the opening 130a includes a lower portion 131a and an upper portion 132a, the opening 130b includes a lower portion 131b and an upper portion 132b, the opening 130c includes a lower portion 131c and an upper portion 132c, and the opening 130d includes a lower portion 131d and an upper portion 132d.

Still referring to FIG. 9, each of the lower portion of the openings 130a, 130b, 130c, 130d has a width greater than the corresponding width of the upper portion, in accordance with some embodiments. For example, the lower portion 131a of the opening 130a has a width W1, the upper portion 132a of the opening 130a has a width W2, and the width W1 is greater than the width W2. In addition, the dielectric layer 123 includes silicon oxide, silicon nitride, silicon oxynitride, or another applicable material, and the dielectric layer 123 is formed by a CVD process, a plasma-enhanced chemical vapor deposition (PECVD) process, or another applicable process.

Figure 10:
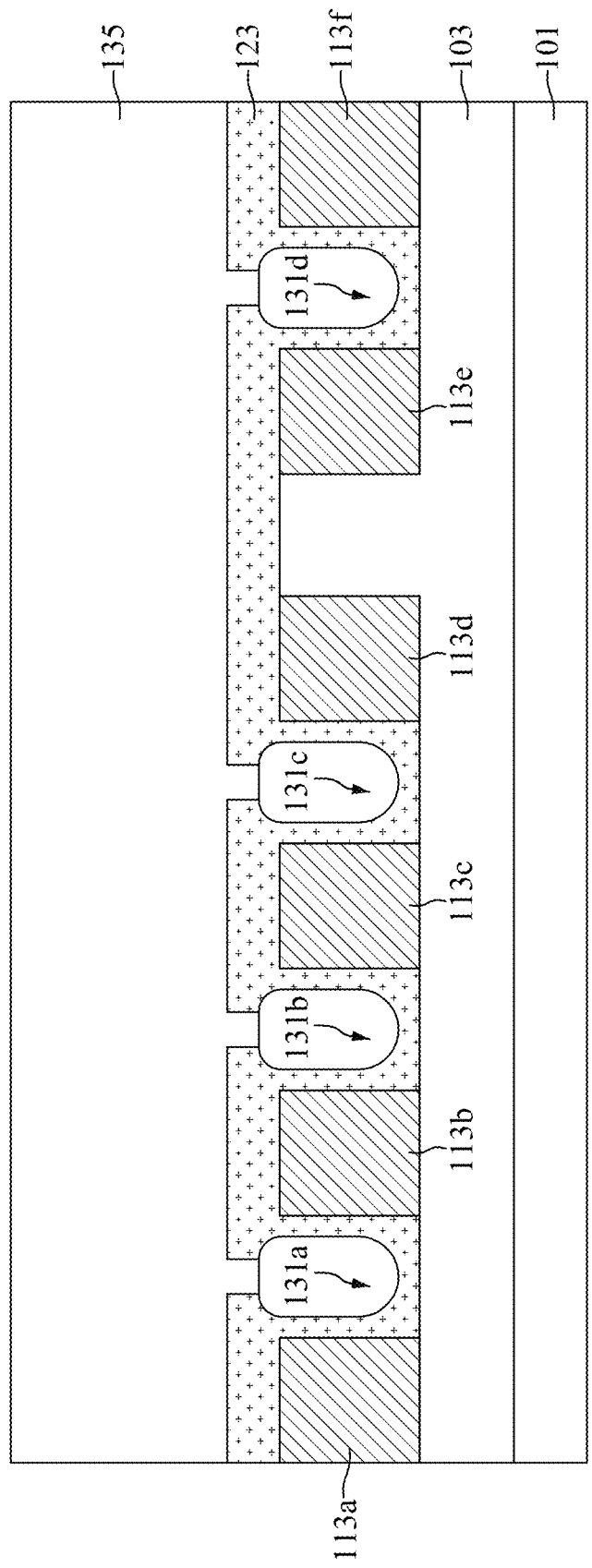
FIG. 10 is a cross-sectional view illustrating an intermediate stage of forming a third dielectric layer over the second dielectric layer during the formation of the semiconductor device, in accordance with some embodiments.

Subsequently, the dielectric layer 135 is formed over the dielectric layer 123, as shown in FIG. 10 in accordance with some embodiments. In some embodiments, the openings 130a, 130b, 130c, 130d are not entirely filled by the dielectric layer 135, such that the air gaps 131a, 131b, 131c and 131d are formed. The respective step is illustrated as the step S17 in the method 10 shown in FIG. 3.

Specifically, the dielectric layer 135 extends to fill the upper portions 132a, 132b, 132c and 132d of the openings 130a, 130b, 130c, 130d, and the remaining portions of the openings 130a, 130b, 130c, 130d (i.e., the lower portions 131a, 131b, 131c and 131d) are enclosed by the dielectric layers 135 and 123, such that the air gaps 131a, 131b, 131c and 131d are obtained. Some materials and processes used to form the dielectric layer 135 are similar to, or the same as those used to form the dielectric layer 123, and details thereof are not repeated herein. In some embodiments, the dielectric layer 135 is formed from a material that has a high etching selectivity compared to the material of the dielectric layer 123.

Figure 11:
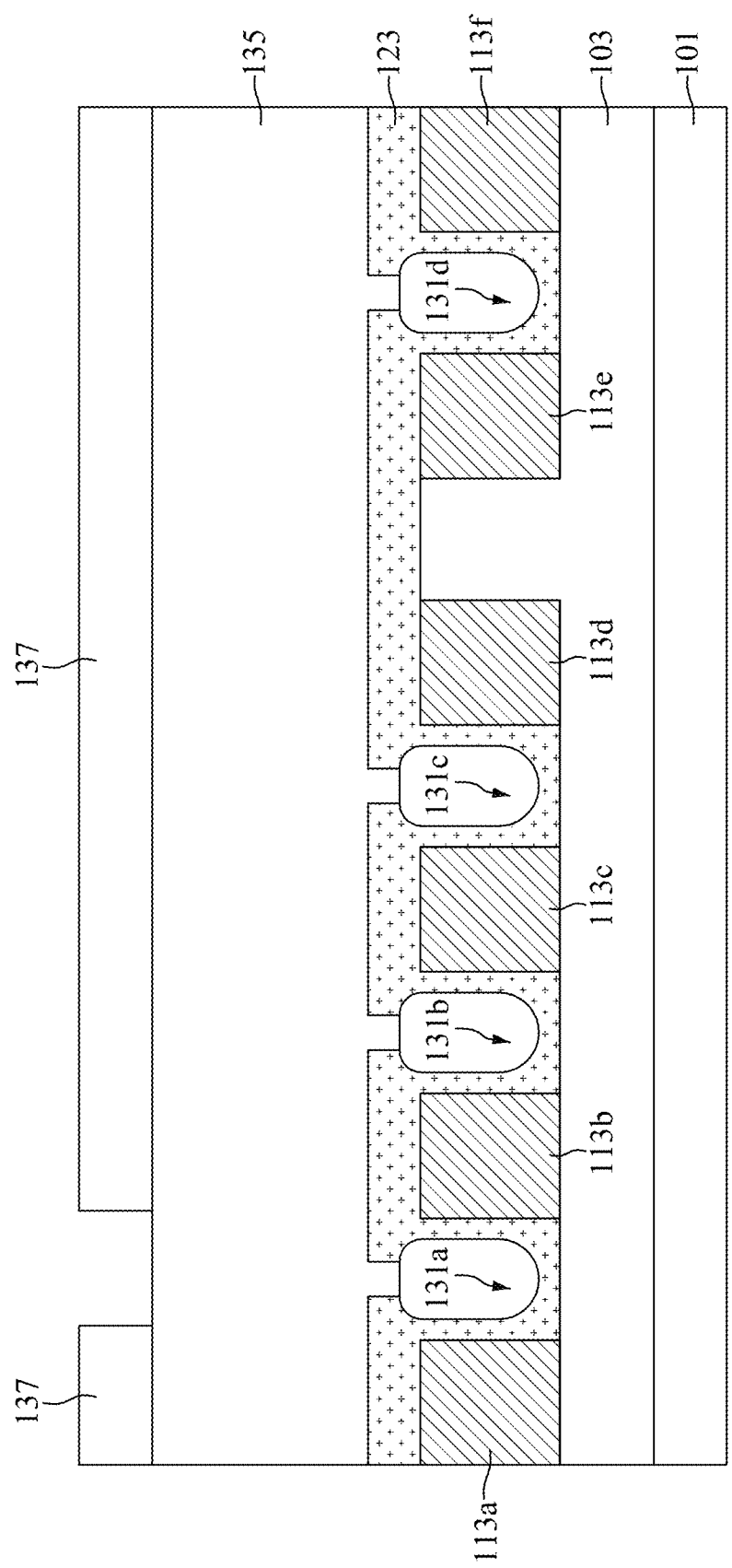
FIG. 11 is a cross-sectional view illustrating an intermediate stage of forming a patterned mask over the third dielectric layer during the formation of the semiconductor device, in accordance with some embodiments.
Figure 12:
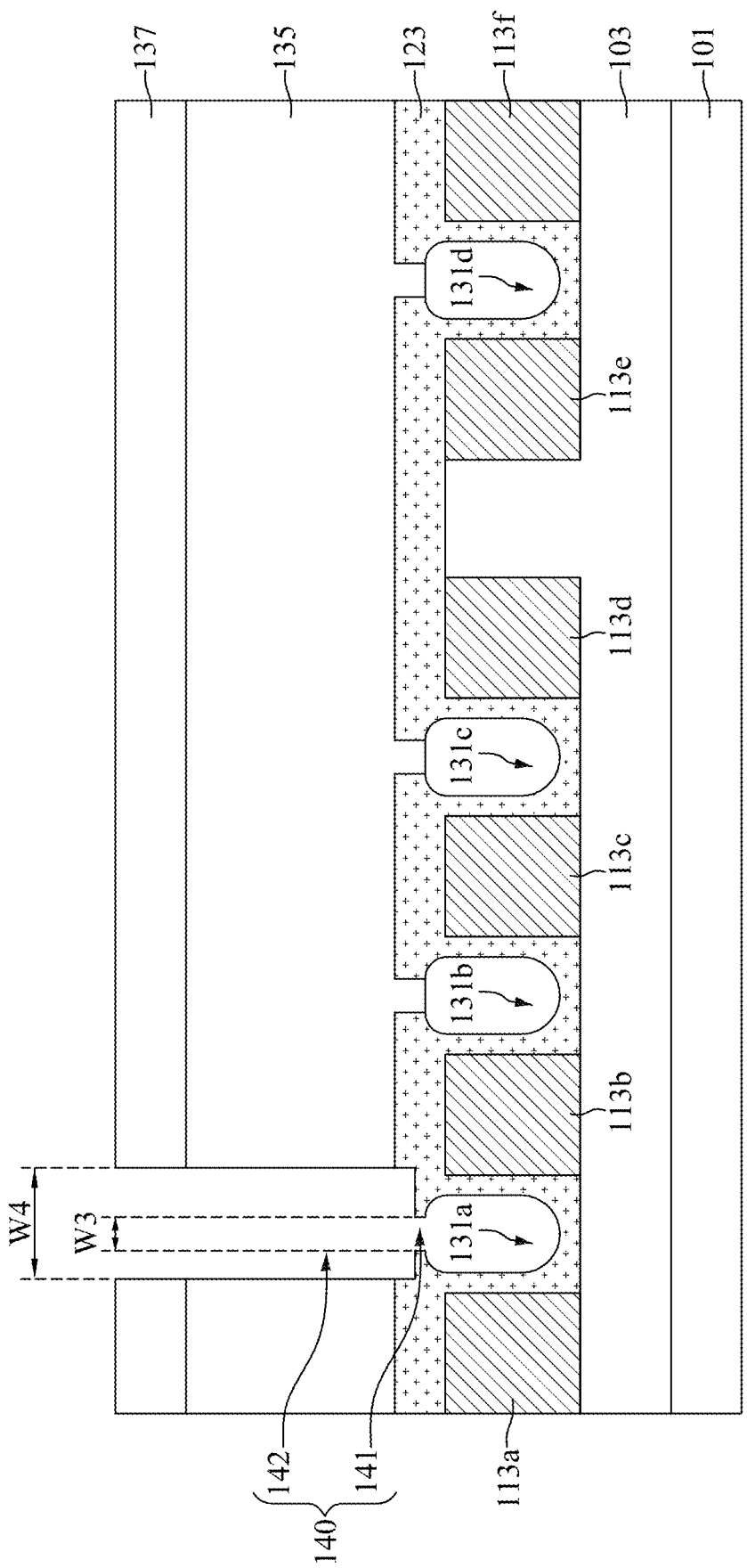
FIG. 12 is a cross-sectional view illustrating an intermediate stage of etching third dielectric layer and the second dielectric layer by using the patterned mask as a mask during the formation of the semiconductor device, in accordance with some embodiments.

After the air gaps 131a, 131b, 131c and 131d are obtained, a patterned mask 137 is formed over the dielectric layer 135, as shown in FIG. 11 in accordance with some embodiments. Then, the dielectric layer 135 is etched by using the patterned mask 137 as a mask, such that an opening 140 is formed penetrating through the dielectric layer 135, as shown in FIG. 12 in accordance with some embodiments. The etching process may include a wet etching process, a dry etching process, or a combination thereof.

In some embodiments, the opening 140 extends from the dielectric layer 135 into the dielectric layer 123 to connect the air gap 131a. The respective step is illustrated as the step S19 in the method 10 shown in FIG. 3. As mentioned above, since the dielectric layer 135 is formed from a material that has a high etching selectivity compared to the material of the dielectric layer 123, the dielectric layer 135 is etched through, while the dielectric layer 123 is slightly removed, and the etching process is performed until the enclosed air gap 131a is opened.

In particular, the opening 140 includes a lower portion 141 and an upper portion 142. In some embodiments, the lower portion 141 of the opening 140 has a width W3, the upper portion 142 of the opening 140 has a width W4, and the width W4 is greater than the width W3. After the opening 140 is obtained, the patterned mask 137 may be removed.

Figure 13:
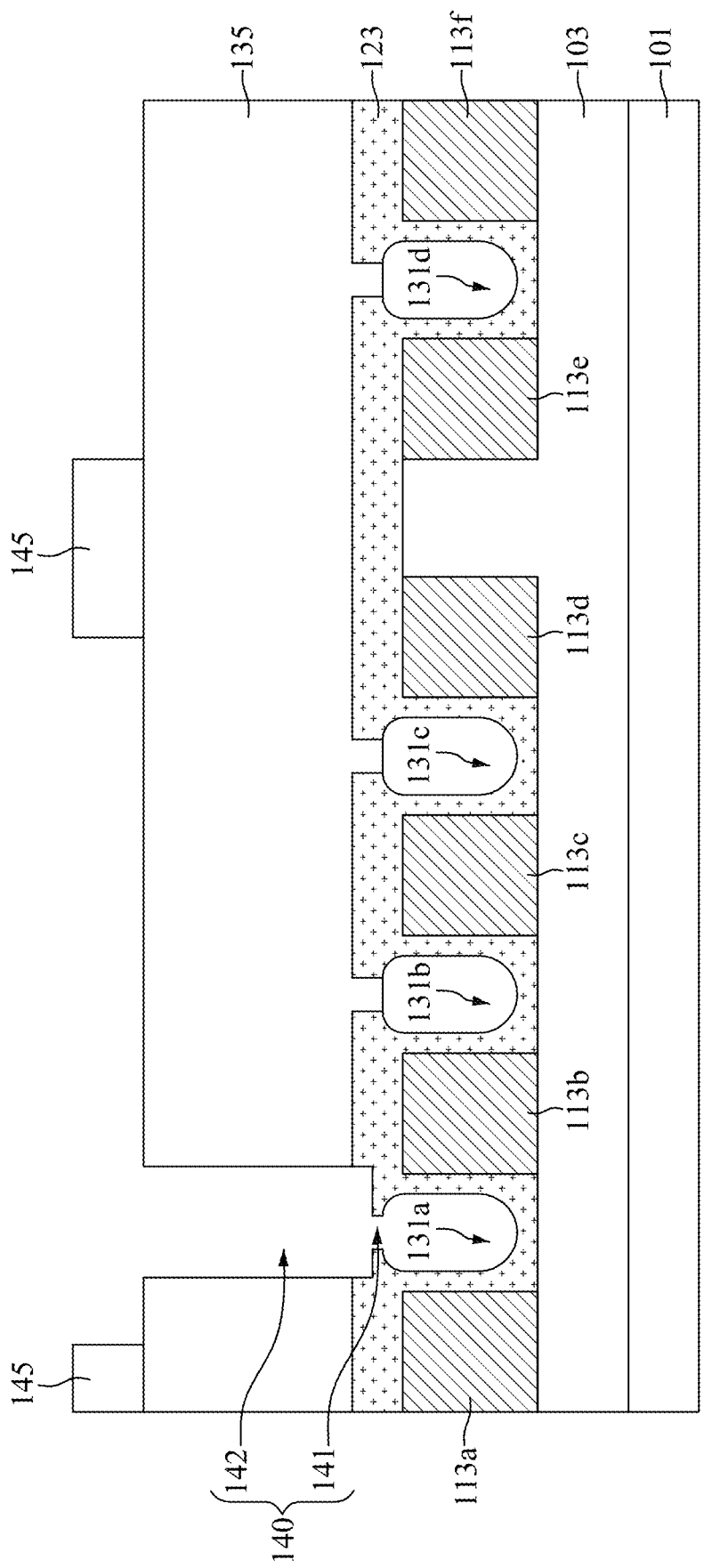
FIG. 13 is a cross-sectional view illustrating an intermediate stage of forming a patterned mask over the third dielectric layer during the formation of the semiconductor device, in accordance with some embodiments.
Figure 14:
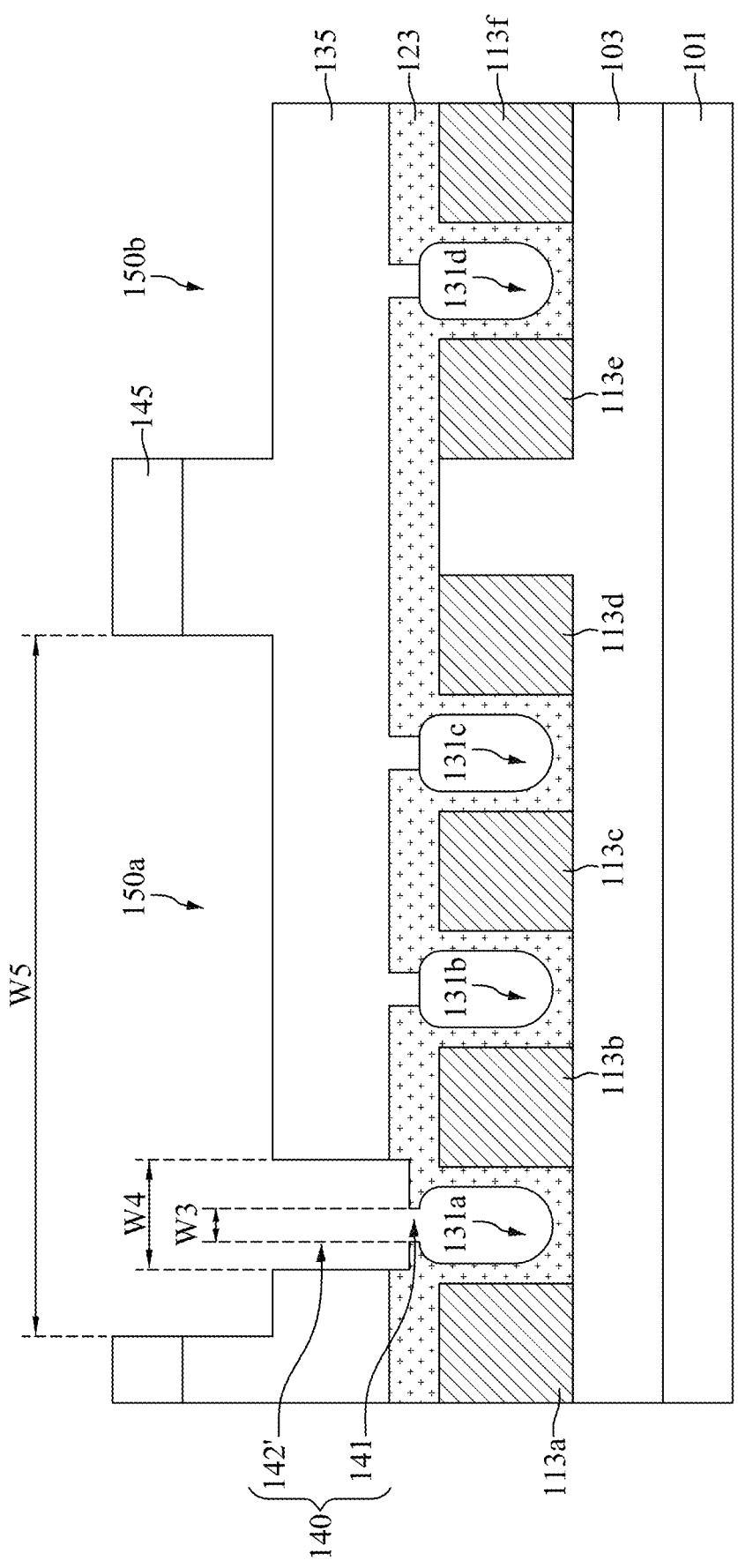
FIG. 14 is a cross-sectional view illustrating an intermediate stage of etching an upper portion of the third dielectric layer by using the patterned mask as a mask during the formation of the semiconductor device, in accordance with some embodiments.

Next, another patterned mask 145 is formed over the dielectric layer 135, as shown in FIG. 13 in accordance with some embodiments. Then, the dielectric layer 135 is etched by using the patterned mask 145 as a mask, such that openings 150a and 150b are formed in the upper portion of the dielectric layer 135, as shown in FIG. 14 in accordance with some embodiments. The etching process may include a wet etching process, a dry etching process, or a combination thereof.

In some embodiments, the opening 150a is formed by enlarging the upper portion of the opening 140. After the etching process for forming the openings 150a and 150b, the opening 150a is connected to the remaining upper portion 142' of the opening 140. In particular, the opening 150a has a width W5, and the width W5 is greater than the width W4 of the remaining upper portion 142' of the opening 140. After the openings 150a and 150b are obtained, the patterned mask 145 may be removed.

Referring back to FIG. 1, a conductive material is deposited to form the electrode 153 in the exposed air gap 131a, the fuse link 155 in the lower portion 141 of the opening 140, the electrode 157 in the upper portion 142' of the opening 140, and the conductive lines 161a, 161b in the openings 150a, 150b, in accordance with some embodiments. The respective step is illustrated as the step S21 in the method 10 shown in FIG. 3. In some embodiments, the electrodes 153 and 157, the fuse link 155, and the conductive lines 161a and 161b are formed by a deposition process and a subsequent planarization process. In other words, the electrodes 153, 157, the fuse link 155, and the conductive lines 161a, 161b are formed simultaneously.

In some embodiments, the electrodes 153 and 157, the fuse link 155, and the conductive lines 161a and 161b include aluminum (Al), copper (Cu), tungsten (W), titanium (Ti), tantalum (Ta), or another applicable conductive material. The formation of the electrodes 153, 157, the fuse link 155, and the conductive lines 161a, 161b may include conformally depositing a conductive material (not shown) over the dielectric layer 135 and filling the air gap 131a, the openings 140, 150a, 150b, and performing a planarization process to remove excess portion of the conductive material over the top surface of the dielectric layer 135.

The deposition process for forming the electrodes 153 and 157, the fuse link 155, and the conductive lines 161a and 161b may include a CVD process, a PVD process, an ALD process, a plating process, a sputtering process, or a combination thereof. The planarization process for forming the electrodes 153, 157, the fuse link 155, and the conductive lines 161a, 161b may include a CMP process. After the planarization process, the semiconductor device 100 is obtained.

Figure 15:
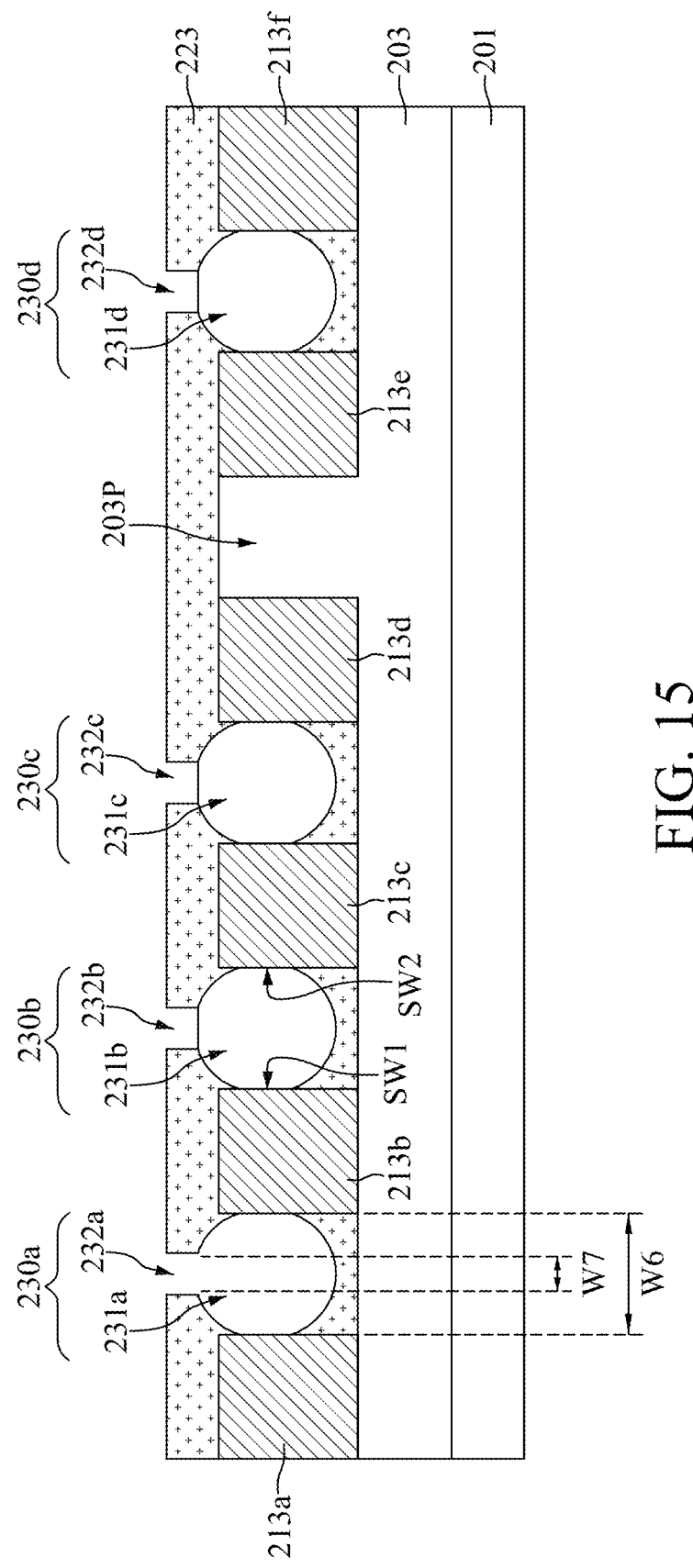
FIG. 15 is a cross-sectional view illustrating an intermediate stage of forming a second dielectric layer over the first dielectric layer and the conductive lines during the formation of the modified semiconductor device, in accordance with some embodiments.

FIGS. 15 to 20 are cross-sectional views illustrating intermediate stages of forming the modified semiconductor device 200, in accordance with some embodiments. As shown in FIG. 15, the semiconductor substrate 201 is provided. Some materials used to form the semiconductor substrate 201 are similar to, or the same as those used to form the semiconductor substrate 101 of the semiconductor device 100, and details thereof are not repeated herein.

Moreover, the dielectric layer 203 with the protruded portion 203P is formed over the semiconductor substrate 201, and the conductive lines 213a, 213b, 213c, 213d, 213e and 213f are formed over the dielectric layer 203, as shown in FIG. 15 in accordance with some embodiments. The respective steps are illustrated as the steps S31 and S33 in the method 30 shown in FIG. 4. Some materials and processes used to form the dielectric layer 203 and the conductive lines 213a, 213b, 213c, 213d, 213e, 213f are similar to, or the same as those used to form the dielectric layer 103 and the conductive lines 113a, 113b, 113c, 113d, 113e, 113f of the semiconductor device 100, and details thereof are not repeated herein.

Next, the dielectric layer 223 is conformally deposited over the conductive lines 213a, 213b, 213c, 213d, 213e and 213f, in accordance with some embodiments. The respective step is illustrated as the step S35 in the method 30 shown in FIG. 4. In some embodiments, the top surface of the protruded portion 203P of the dielectric layer 203 is covered by the dielectric layer 223.

In some embodiments, the dielectric layer 223 extends into the spaces between the conductive lines 213a, 213b, 213c, 213d, 213e and 213f to line the sidewalls of the conductive lines 213a, 213b, 213c, 213d, 213e and 213f, such that openings 230a, 230b, 230c, 230d are formed between the conductive lines 213a, 213b, 213c, 213d, 213e and 213f. Moreover, each of the openings 230a, 230b, 230c, 230d includes a lower portion and an upper portion. For example, the opening 230a includes a lower portion 231a and an upper portion 232a, the opening 230b includes a lower portion 231b and an upper portion 232b, the opening 230c includes a lower portion 231c and an upper portion 232c, and the opening 230d includes a lower portion 231d and an upper portion 232d.

Each of the lower portion of the openings 230a, 230b, 230c, 230d has a width greater than the corresponding width of the upper portion, in accordance with some embodiments. For example, the lower portion 231a of the opening 230a has a width W6, the upper portion 232a of the opening 230a has a width W7, and the width W6 is greater than the width W7. In some embodiments, the width W7 of FIG. 15 is greater than the width W1 of FIG. 9.

Some materials and processes used to form the dielectric layer 223 are similar to, or the same as those used to form the dielectric layer 123 of the semiconductor device 100, and details thereof are not repeated herein. It should be noted that the deposition process for forming the dielectric layer 223 is controlled to partially expose the sidewalls of the conductive lines 213a, 213b, 213c, 213d, 213e and 213f. For example, the sidewall SW1 of the conductive line 213b and the sidewall SW2 of the conductive line 213c are partially exposed by the lower portion 231b of the openings 230b.

Figure 16:
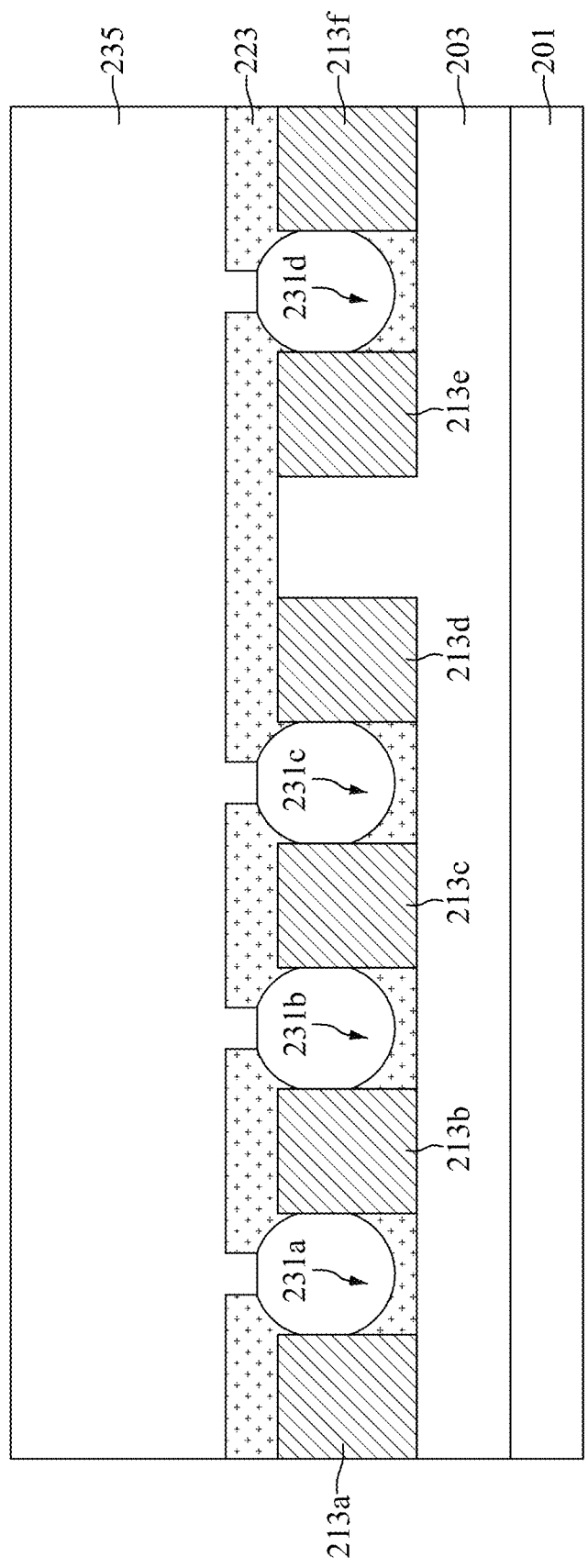
FIG. 16 is a cross-sectional view illustrating an intermediate stage of forming a third dielectric layer over the second dielectric layer during the formation of the modified semiconductor device, in accordance with some embodiments.

Subsequently, the dielectric layer 235 is formed over the dielectric layer 223, as shown in FIG. 16 in accordance with some embodiments. In some embodiments, the openings 230a, 230b, 230c, 230d are not entirely filled by the dielectric layer 235, such that the air gaps 231a, 231b, 231c and 231d are formed. The respective step is illustrated as the step S37 in the method 30 shown in FIG. 4.

Specifically, the dielectric layer 235 extends to fill the upper portions 232a, 232b, 232c and 232d of the openings 230a, 230b, 230c, 230d, and the remaining portions of the openings 230a, 230b, 230c, 230d (i.e., the lower portions 231a, 231b, 231c and 231d) are enclosed by the dielectric layers 235 and 223, such that the air gaps 231a, 231b, 231c and 231d are obtained. Some materials and processes used to form the dielectric layer 235 are similar to, or the same as those used to form the dielectric layer 135 of the semiconductor device 100, and details thereof are not repeated herein. In some embodiments, the dielectric layer 235 is formed from a material that has a high etching selectivity compared to the material of the dielectric layer 223.

Figure 17:
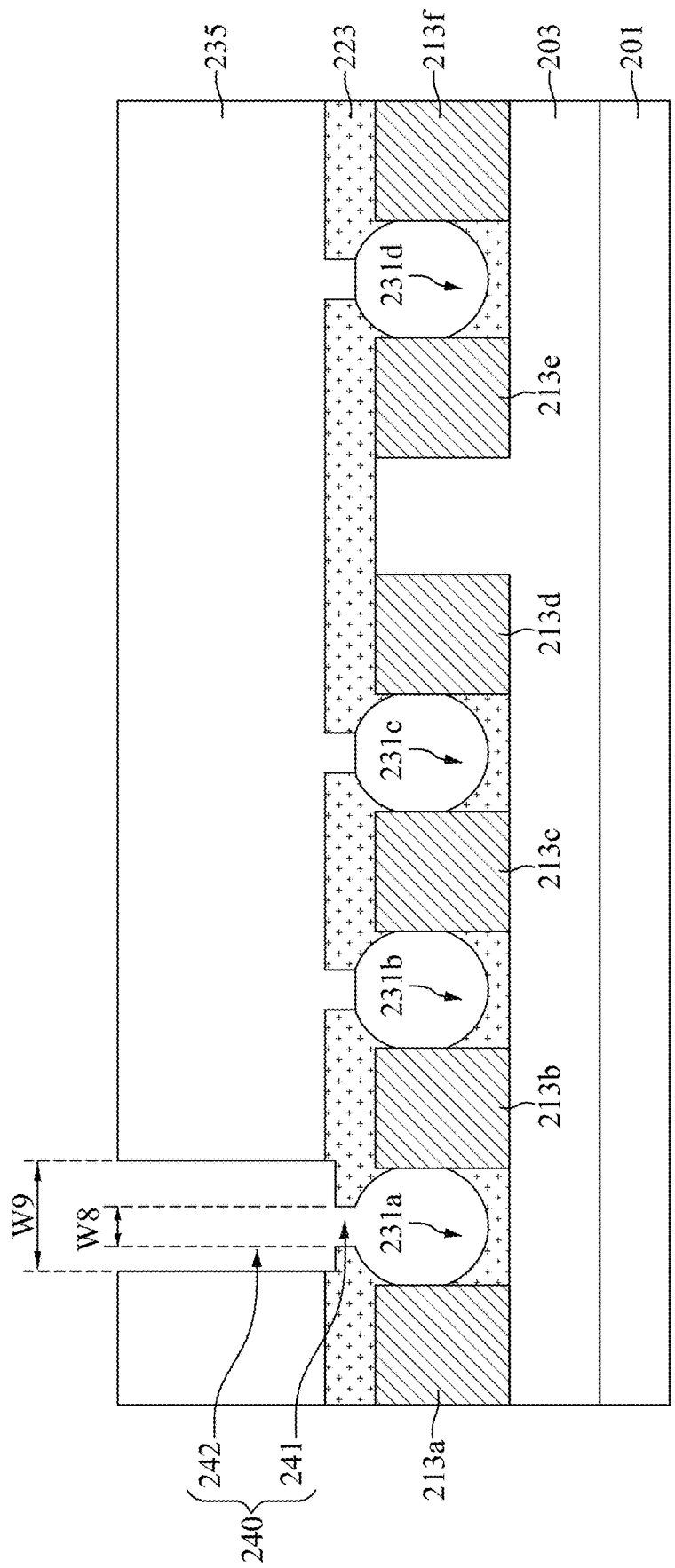
FIG. 17 is a cross-sectional view illustrating an intermediate stage of forming an opening in the third dielectric layer and the second dielectric layer during the formation of the modified semiconductor device, in accordance with some embodiments.

After the air gaps 231a, 231b, 231c and 231d are obtained, the dielectric layer 235 is etched to form an opening 240 penetrating through the dielectric layer 235 and exposing the air gap 231a, as shown in FIG. 17 in accordance with some embodiments. The respective step is illustrated as the step S39 in the method 30 shown in FIG. 4. The etching process may include a wet etching process, a dry etching process, or a combination thereof, and a patterned mask (not shown) may be used to perform the etching process.

In some embodiments, the opening 240 extends from the dielectric layer 235 into the dielectric layer 223 to connect the air gap 231a. As mentioned above, since the dielectric layer 235 is formed from a material that has a high etching selectivity compared to the material of the dielectric layer 223, the dielectric layer 235 is etched through, while the dielectric layer 223 is slightly removed, and the etching process is performed until the enclosed air gap 231a is opened. In particular, the opening 240 includes a lower portion 241 and an upper portion 242. In some embodiments, the lower portion 241 of the opening 240 has a width W8, the upper portion 242 of the opening 240 has a width W9, and the width W9 is greater than the width W8.

Figure 18:
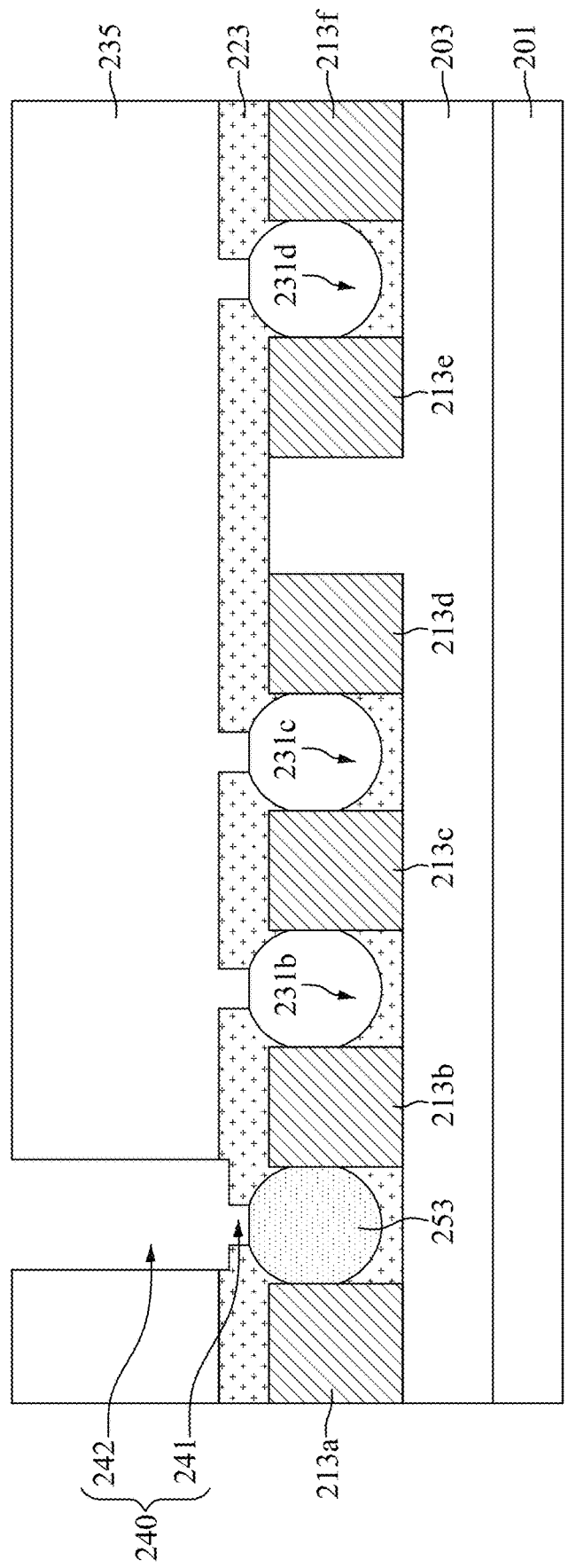
FIG. 18 is a cross-sectional view illustrating an intermediate stage of forming a first electrode between two adjacent conductive lines through the opening in the third dielectric layer during the formation of the modified semiconductor device, in accordance with some embodiments.

Next, the air gap 231a is filled by the electrode 253, as shown in FIG. 18 in accordance with some embodiments. The respective step is illustrated as the step S41 in the method 30 shown in FIG. 4. In some embodiments, the electrode 253 is in direct contact with the conductive lines 213a and 213b.

In some embodiments, the electrode 253 includes aluminum (Al), copper (Cu), tungsten (W), titanium (Ti), tantalum (Ta), or another applicable conductive material. The formation of the electrode 253 may include conformally depositing a conductive material (not shown) over the dielectric layer 235 and filling the air gap 231a and the openings 240, and performing an etch back process to recess the conductive material such that the opening 240 is not filled. The deposition process for forming the electrode 253 may include a CVD process, a PVD process, an ALD process, a plating process, a sputtering process, or a combination thereof.

Figure 19:
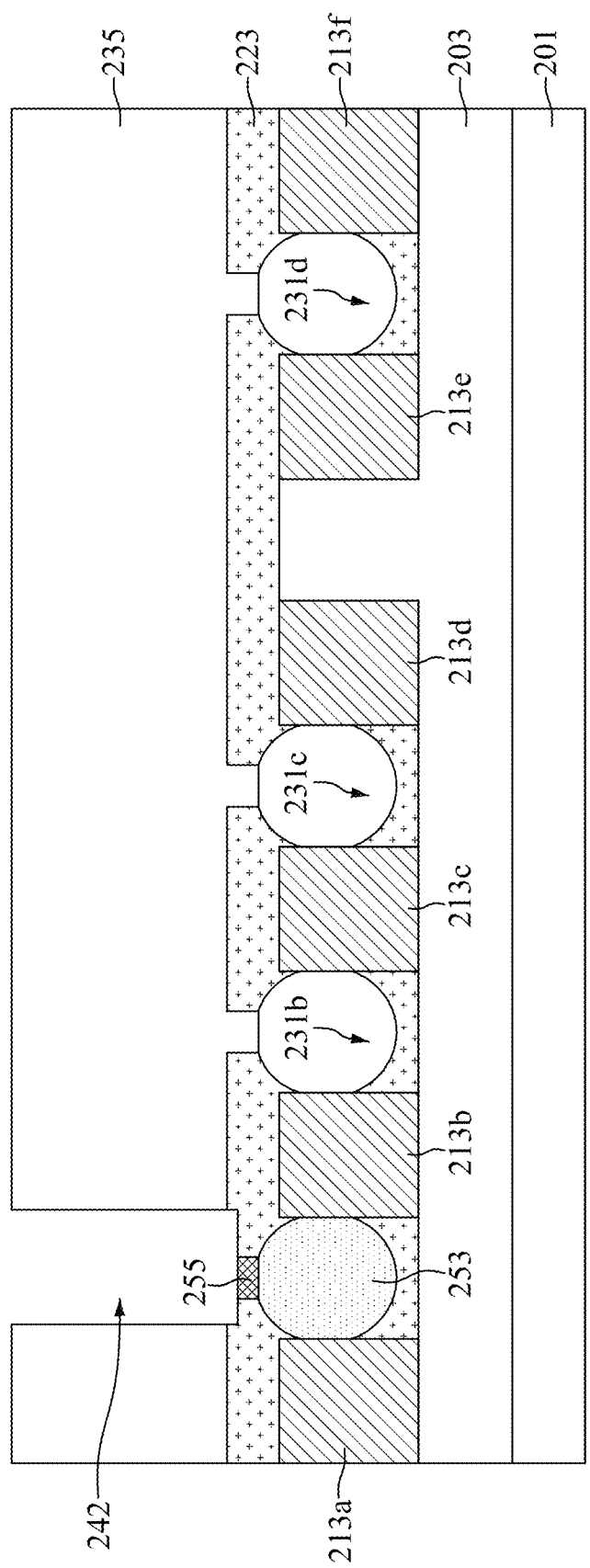
FIG. 19 is a cross-sectional view illustrating an intermediate stage of forming a dielectric portion over the first electrode during the formation of the modified semiconductor device, in accordance with some embodiments.

Then, the lower portion 241 of the opening 240 is filled by the dielectric portion 255, as shown in FIG. 19 in accordance with some embodiments. The respective step is illustrated as the step S43 in the method 30 shown in FIG. 4. In some embodiments, the dielectric portion 225 is formed over the electrode 253.

In some embodiments, the dielectric portion 255 includes silicon oxide, silicon nitride, silicon oxynitride, or another applicable material. The formation of the dielectric portion 255 may include conformally depositing a dielectric material (not shown) over the dielectric layer 235 and filling the opening 240, and performing an etch back process to recess the dielectric material such that the upper portion 242 of the opening 240 is not filled. The deposition process for forming the dielectric portion 255 may include a CVD process, a PVD process, an ALD process, or a combination thereof.

Figure 20:
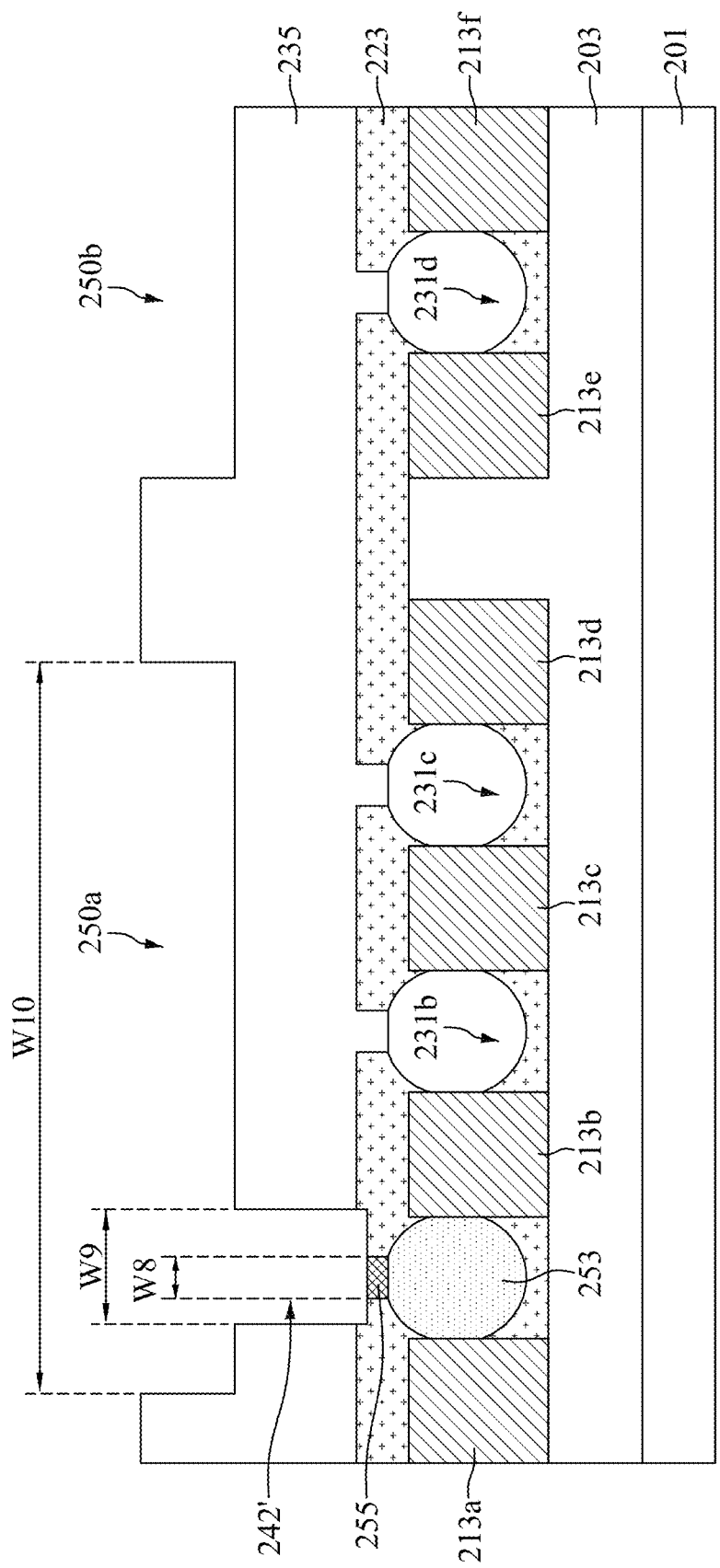
FIG. 20 is a cross-sectional view illustrating an intermediate stage of enlarging an upper portion of the opening in the third dielectric layer during the formation of the modified semiconductor device, in accordance with some embodiments.

Next, the dielectric layer 235 is etched to form openings 250a and 250b in the upper portion of the dielectric layer 235, as shown in FIG. 20 in accordance with some embodiments. The respective step is illustrated as the step S39 in the method 30 shown in FIG. 4. The etching process may include a wet etching process, a dry etching process, or a combination thereof, and a patterned mask (not shown) may be used to perform the etching process.

In some embodiments, the opening 250a is formed by enlarging the upper portion of the opening 240. After the etching process for forming the openings 250a and 250b, the opening 250a is connected to the remaining upper portion 242' of the opening 240. In particular, the opening 250a has a width W10, and the width W10 is greater than the width W9 of the remaining upper portion 242' of the opening 240.

Referring back to FIG. 2, a conductive material is deposited to form the electrode 257 in the upper portion 242' of the opening 240, and the conductive lines 261a, 261b in the openings 250a, 250b, in accordance with some embodiments. The respective step is illustrated as the step S45 in the method 30 shown in FIG. 4. In some embodiments, the electrode 257 and the conductive lines 261a and 261b are formed by a deposition process and a subsequent planarization process. In other words, the electrode 257 and the conductive lines 261a, 261b are formed simultaneously.

In some embodiments, the electrode 257 and the conductive lines 261a and 261b include aluminum (Al), copper (Cu), tungsten (W), titanium (Ti), tantalum (Ta), or another applicable conductive material. The formation of the electrode 257 and the conductive lines 261a, 261b may include conformally depositing a conductive material (not shown) over the dielectric layer 235 and filling the upper portion 242' of the opening 140 and the openings 150a and 150b, and performing a planarization process to remove excess portion of the conductive material over the top surface of the dielectric layer 235.

The deposition process for forming the electrode 257 and the conductive lines 261a, 261b may include a CVD process, a PVD process, an ALD process, a plating process, a sputtering process, or a combination thereof. The planarization process for forming the electrode 257 and the conductive lines 261a, 261b may include a CMP process. After the planarization process, the semiconductor device 200 is obtained.

Embodiments of the semiconductor devices 100 and 200 are provided in the disclosure. In some embodiments, the semiconductor device 100 includes the fuse link 155 disposed over the first electrode 153, the second electrode 157 disposed over the fuse link 155, the third electrode 113b disposed adjacent to the first electrode 153, and the dielectric layer 123 separating the first electrode 153 and the third electrode 113b. The first electrode 153, the fuse link 155, and the second electrode 157 form the vertical fuse structure 159, and the first electrode 153, the third electrode 113b and a portion of the dielectric layer 1239 between the first electrode 153 and the third electrode 113b form the lateral anti-fuse structure 169. Therefore, the vertical fuse structure 159 and the lateral anti-fuse structure 169 may be integrated. In some embodiments, the semiconductor device 200 includes the dielectric portion 255 disposed over the first electrode 253, the second electrode 257 disposed over the dielectric portion 255, the third electrode 213b disposed adjacent to and in direct contact with the first electrode 253. The first electrode 253, the dielectric portion 255, and the second electrode 257 form the vertical anti-fuse structure 259, and the first electrode 253 and the third electrode 213b form the lateral fuse structure 269. Therefore, the vertical anti-fuse structure 259 and the lateral fuse structure 269 may be integrated. As a result, the integration of a semiconductor device may be increased.

In one embodiment of the present disclosure, a semiconductor device is provided. The semiconductor device includes a first dielectric layer disposed over a semiconductor substrate, and a first electrode disposed over the first dielectric layer. The semiconductor device also includes a fuse link disposed over the first electrode, and a second electrode disposed over the fuse link. The semiconductor device further includes a third electrode disposed adjacent to the first electrode, and a second dielectric layer separating the first electrode from the first dielectric layer and the third electrode. The first electrode, the fuse link, and the second electrode form a fuse structure, and the first electrode, the third electrode, and a portion of the second dielectric layer between the first electrode and the third electrode form an anti-fuse structure.

In another embodiment of the present disclosure, a semiconductor device is provided. The semiconductor device includes a first dielectric layer disposed over a semiconductor substrate, and a first conductive line and a second conductive line disposed over the first dielectric layer and extending parallel to each other. The semiconductor device also includes a second dielectric layer disposed between the first conductive line and the second conductive line. The first conductive line and the second conductive line are covered by the second dielectric layer. The semiconductor device further includes a third dielectric layer disposed over the second dielectric layer. The third dielectric layer has a different etch selectivity than the second dielectric layer. In addition, the semiconductor device includes a first electrode disposed between the first conductive line and the second conductive line. The first electrode has a rounded profile, and the first electrode is separated from the first dielectric layer by the second dielectric layer. The semiconductor device also includes a second electrode disposed over the first electrode. The second electrode extends from the second dielectric layer to the third dielectric layer.

In yet another embodiment of the present disclosure, a semiconductor device is provided. The semiconductor device includes a first dielectric layer disposed over a semiconductor substrate, and a second dielectric layer disposed over the first dielectric layer. The semiconductor device also includes a first electrode disposed in the second dielectric layer, and a dielectric portion disposed over the first electrode. The semiconductor device further includes a second electrode disposed over the dielectric portion, and a third electrode disposed adjacent to and in direct contact with the first electrode. The first electrode, the dielectric portion, and the second electrode form an anti-fuse structure, and the first electrode and the third electrode form a fuse structure.

The embodiments of the present disclosure have some advantageous features. By combining fuse structure and anti-fuse structure in the semiconductor device, the integration of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first dielectric layer disposed over a semiconductor substrate;
   a first electrode disposed over the first dielectric layer;
   a fuse link disposed over the first electrode;
   a second electrode disposed over the fuse link;
   a third electrode disposed adjacent to the first electrode; and
   a second dielectric layer separating the first electrode from the first dielectric layer and the third electrode, wherein the first electrode, the fuse link, and the second electrode form a fuse structure, and wherein the first electrode, the third electrode, and a portion of the second dielectric layer between the first electrode and the third electrode form an anti-fuse structure;
   wherein the first electrode has a first width, the fuse link has a second width, and the second electrode has a third width, and
   wherein the third width is greater than the first width, and the first width is greater than the second width.

2. The semiconductor device of claim 1, wherein the third electrode is in direct contact with the first dielectric layer.

3. The semiconductor device of claim 1, wherein the third electrode is covered by the second dielectric layer.

4. The semiconductor device of claim 1, wherein the first electrode has a rounded profile in a cross-sectional view.

5. The semiconductor device of claim 1, wherein the first electrode and the fuse link are surrounded by the second dielectric layer.

6. The semiconductor device of claim 1, wherein a lower portion of the second electrode is surrounded by the second dielectric layer.

7. A semiconductor device, comprising:
   a first dielectric layer disposed over a semiconductor substrate;
   a first conductive line and a second conductive line disposed over the first dielectric layer and extending parallel to each other;
   a second dielectric layer disposed between the first conductive line and the second conductive line, wherein the first conductive line and the second conductive line are covered by the second dielectric layer;
   a third dielectric layer disposed over the second dielectric layer, wherein the third dielectric layer has a different etch selectivity than the second dielectric layer;
   a first electrode disposed between the first conductive line and the second conductive line, wherein the first electrode has a rounded profile, and the first electrode is separated from the first dielectric layer by the second dielectric layer; and
   a second electrode disposed over the first electrode, wherein the second electrode extends from the second dielectric layer to the third dielectric layer.

8. The semiconductor device of claim 7, wherein the first electrode, the first conductive line, and a portion of the second dielectric layer sandwiched between the first electrode and the first conductive line form an anti-fuse structure.

9. The semiconductor device of claim 8, further comprising:
a fuse link disposed between the first electrode and the second electrode, wherein the first electrode, the second electrode, and the fuse link form a fuse structure.

10. The semiconductor device of claim 7, wherein the first electrode is in direct contact with the first conductive line, and wherein the first electrode and the first conductive line form a fuse structure.

11. The semiconductor device of claim 10, further comprising:
a dielectric portion disposed between the first electrode and the second electrode, wherein the first electrode, the second electrode, and the dielectric portion form an anti-fuse structure.

12. The semiconductor device of claim 11, wherein the dielectric portion has a first width, the second electrode has a second width, and the second width is greater than the first width.

13. The semiconductor device of claim 7, further comprising:
a third conductive line disposed over the first dielectric layer and extending parallel to the first conductive line, wherein the first conductive line is between the second conductive line and the third conductive line, and wherein the first conductive line and the third conductive line have an air gap therebetween, the air gap is sealed by the third dielectric layer.

14. The semiconductor device of claim 13, wherein a sidewall of the first conductive line and a sidewall of the third conductive line are exposed by the air gap.

* * * * *